United States Patent
Ito et al.

(10) Patent No.: US 11,469,370 B2
(45) Date of Patent: Oct. 11, 2022

(54) DOMAIN WALL MOTION TYPE MAGNETIC RECORDING ELEMENT

(71) Applicant: TDK CORPORATION, Tokyo (JP)

(72) Inventors: Kuniyasu Ito, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 233 days.

(21) Appl. No.: 16/760,169

(22) PCT Filed: Jan. 9, 2019

(86) PCT No.: PCT/JP2019/000323
§ 371 (c)(1),
(2) Date: Apr. 29, 2020

(87) PCT Pub. No.: WO2019/139029
PCT Pub. Date: Jul. 18, 2019

(65) Prior Publication Data
US 2020/0259072 A1     Aug. 13, 2020

(30) Foreign Application Priority Data

Jan. 11, 2018    (JP) .............................. JP2018-002469

(51) Int. Cl.
*H01L 43/02*      (2006.01)
*G11C 11/16*      (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC ....... H01L 43/02; H01L 27/222; H01L 43/12; G11C 11/161; H01F 10/3254; H01F 10/3286; H01F 10/329; H01F 41/32
(Continued)

(56) References Cited

U.S. PATENT DOCUMENTS 11,244,781 B2 * 2/2022 Shibata .................... G11B 5/02
2005/0069732 A1 * 3/2005 Kamata .................. G11B 5/855
(Continued)

FOREIGN PATENT DOCUMENTS

| JP | 5441005 B2 | 3/2014 |
|----|------------|--------|
| WO | 2006/046591 A1 | 5/2006 |
| WO | 2009/101827 A1 | 8/2009 |

OTHER PUBLICATIONS

Mar. 19, 2019 International Search Report issued in International Patent Application No. PCT/JP2019/000323.

*Primary Examiner* — Jami Valentine Miller
(74) *Attorney, Agent, or Firm* — Oliff PLC

(57) ABSTRACT

A magnetic domain wall movement type magnetic recording element includes: a first ferromagnetic layer which includes a ferromagnetic body; a non-magnetic layer which faces the first ferromagnetic layer; and a magnetic recording layer which faces a surface of the non-magnetic layer on a side opposite to the first ferromagnetic layer and extends in a first direction. The magnetic recording layer has a concave-convex structure on a second surface opposite to a first surface which faces the non-magnetic layer.

20 Claims, 18 Drawing Sheets

(51) Int. Cl.
  *H01F 10/32* (2006.01)
  *H01F 41/32* (2006.01)
  *H01L 27/22* (2006.01)
  *H01L 43/12* (2006.01)

(52) U.S. Cl.
  CPC ..... *H01F 10/3254* (2013.01); *H01F 10/3286* (2013.01); *H01F 41/32* (2013.01); *H01L 27/222* (2013.01); *H01L 43/12* (2013.01)

(58) Field of Classification Search
  USPC .......................................................... 257/421
  See application file for complete search history.

(56) References Cited

U.S. PATENT DOCUMENTS

| | | | |
|---|---|---|---|
| 2007/0218318 A1* | 9/2007 | Watanabe | G11B 5/7377 |
| | | | 428/836 |
| 2008/0130355 A1* | 6/2008 | Saitoh | G11C 11/161 |
| | | | 257/E27.005 |
| 2011/0129691 A1 | 6/2011 | Ishiwata et al. | |
| 2017/0241803 A1* | 8/2017 | Ausserlechner | G01D 5/145 |
| 2019/0283127 A1* | 9/2019 | Kinouchi | H01F 1/24 |
| 2022/0007556 A1* | 1/2022 | Miyano | H05K 9/0088 |

* cited by examiner

DOMAIN WALL MOTION TYPE MAGNETIC RECORDING ELEMENT

TECHNICAL FIELD

The present invention relates to a magnetic domain wall movement type magnetic recording element. Priority is claimed on Japanese Patent Application No. 2018-002469, filed Jan. 11, 2018, the content of which is incorporated herein by reference.

BACKGROUND ART

As a next-generation non-volatile memory which replaces a flash memory or the like of which miniaturization has come to a limit, attention has been focused on a resistance change type magnetic recording device which stores data using a resistance change type element. Examples of the magnetic recording device include a magnetoresistive random access memory (MRAM), a resistance random access memory (ReRAM), a phase change random access memory (PCRAM), and the like.

As a method of increasing a density (enlarging a capacity) of a memory, there is a method of multi-valuing recording bits per element constituting the memory, in addition to a method of reducing a size of the element itself constituting the memory.

Patent Literature 1 describes a magnetic domain wall movement type magnetic recording element which can record multi-valued data by moving a magnetic domain wall in a magnetic recording layer. Patent Literature 1 describes that multi-valued data recording is stabilized by providing a trap site in a magnetic recording layer.

CITATION LIST

Patent Literature

[Patent Literature 1] Japanese Patent No. 5441005

SUMMARY OF INVENTION

Technical Problem

The magnetic domain wall movement type magnetic recording element described in Patent Literature 1 has concavity and convexity on a side surface of the magnetic recording layer. The concavity and convexity serve as a trap site of the magnetic domain wall and control a position of the magnetic domain wall. However, in order to form the concavity and convexity on the side surface, it is necessary to perform post-processing after layers are laminated. In the case of the post-processing, damage or the like occurs on a lamination surface on which a ferromagnetic layer is laminated. The magnetic domain wall movement type magnetic recording element reads and writes data using a change in magnetoresistance. The change in magnetoresistance is caused by a change in the magnetization state between the magnetic recording layer and the ferromagnetic layer which sandwich a non-magnetic layer. Damage to the lamination surface causes a decrease in a magnetoresistance change rate (MR ratio). Further, Patent Literature 1 also describes that the trap site is provided on the lamination surface of the magnetic recording layer. Also in this case, the trap site reduces magnetization stability of a ferromagnetic body and causes noise.

The present invention has been made in view of the above circumstances, and an object thereof is to provide a magnetic domain wall movement type magnetic recording element which controls movement of a magnetic domain wall, curbs a decrease in a magnetoresistance change rate (MR ratio), and has little noise.

Solution to Problem

The present invention provides the following means to solve the above problems.

(1) A magnetic domain wall movement type magnetic recording element according to a first aspect includes a first ferromagnetic layer which includes a ferromagnetic body, a non-magnetic layer which faces the first ferromagnetic layer, and a magnetic recording layer which faces a surface of the non-magnetic layer on a side opposite to the first ferromagnetic layer and extends in a first direction, wherein the magnetic recording layer has a concave-convex structure on a second surface opposite to a first surface which faces the non-magnetic layer.

(2) In the magnetic domain wall movement type magnetic recording element according to the above-described aspect, the first surface may have a smaller arithmetic average roughness than an arithmetic average roughness of the second surface.

(3) In the magnetic domain wall movement type magnetic recording element according to the above-described aspect, in the concave-convex structure, an arrangement of convex portions constituting the concave-convex structure may be irregularly spaced in plan view in a lamination direction.

(4) The magnetic domain wall movement type magnetic recording element according to the above-described aspect may further include a base body which faces the second surface of the magnetic recording layer, and an intermediate body which is located between the base body and the magnetic recording layer.

(5) In the magnetic domain wall movement type magnetic recording element according to the above-described aspect, the intermediate body may be a non-magnetic trap-reinforcing member, and the trap-reinforcing member may be layers which are scattered on one surface of the base body or a layer which has concavity and convexity on the second surface side of the magnetic recording layer.

(6) In the magnetic domain wall movement type magnetic recording element according to the above-described aspect, the intermediate body may have a trap-reinforcing member, and an insulating layer which covers the trap-reinforcing member from a position near the base body, and the trap-reinforcing member may be layers which are scattered on one surface of the base body or a layer which has concavity and convexity on the second surface side of the magnetic recording layer.

(7) In the magnetic domain wall movement type magnetic recording element according to the above-described aspect, one end of the trap-reinforcing member may be in contact with the base body, and when a surface energy of a material constituting a surface of the base body is $\gamma_A$, and a surface energy of a material of the trap-reinforcing member is $\gamma_B$, $\gamma_B < \gamma_A$, and a surface energy mismatch $\Gamma_{AB}$ defined by the following Equation (1) may be larger than 0.5.

[Math 1]

$$\Gamma_{AB} = 2\left|\frac{\gamma_A - \gamma_B}{\gamma_A + \gamma_B}\right| \quad (1)$$

(8) In the magnetic domain wall movement type magnetic recording element according to the above-described aspect, a plurality of recording parts which includes the first ferromagnetic layer, the nonmagnetic layer and the magnetic recording layer may be provided, the plurality of recording parts may be arranged in a second direction which intersects the first direction, and the trap-reinforcing member may spread in a same plane over the plurality of recording parts.

(9) In the magnetic domain wall movement type magnetic recording element according to the above-described aspect, a plurality of recording parts which includes the first ferromagnetic layer, the nonmagnetic layer and the magnetic recording layer may be provided, and the trap-reinforcing member or a convex portion of the trap-reinforcing member may extend in a second direction which intersects the first direction over the plurality of recording parts.

(10) In the magnetic domain wall movement type magnetic recording element according to the above-described aspect, the concave-convex structure may have periodicity in the first direction.

(11) In the magnetic domain wall movement type magnetic recording element according to the above-described aspect, the concave-convex structure may have a concave portion or a convex portion having a first shape, and a concave portion or a convex portion having a second shape having a larger volume than that of the first shape.

(12) In the magnetic domain wall movement type magnetic recording element according to the above-described aspect, the concave portion or the convex portion having the second shape may be located at a position at which the concave portion or the convex portion having the second shape overlaps an end surface of the first ferromagnetic layer in plan view in the lamination direction.

(13) In the magnetic domain wall movement type magnetic recording element according to the above-described aspect, the concave or convex portion having the second shape may be larger than the concave or convex portion having the first shape in the first direction.

(14) In the magnetic domain wall movement type magnetic recording element according to the above-described aspect, the concave or convex portion having the second shape may be larger than the concave or convex portion having the first shape in the lamination direction.

(15) In the magnetic domain wall movement type magnetic recording element according to the above-described aspect, a second ferromagnetic layer which reflects a magnetization state of the magnetic recording layer may be provided between the magnetic recording layer and the non-magnetic layer.

(16) A magnetic domain wall movement type magnetic recording element according to a second aspect includes a recording part which includes a first ferromagnetic layer which includes a ferromagnetic body, a magnetic recording layer which is laminated on one side of the first ferromagnetic layer, extends in a first direction which intersects a lamination direction, has a magnetic domain wall, and has a concave-convex structure which traps the magnetic domain wall on a side opposite to the first ferromagnetic layer, and a non-magnetic layer sandwiched between the first ferromagnetic layer and the magnetic recording layer, and a control part which has a planarization layer laminated on a side of the magnetic recording layer opposite to the first ferromagnetic layer and planarizes the concave-convex structure of the magnetic recording layer.

Advantageous Effects of Invention

According to the magnetic domain wall movement type magnetic recording element of the above-described aspect, it is possible to control movement of a magnetic domain wall, to curb a decrease in a magnetoresistance change rate (MR ratio) and to have little noise.

BEST MODE FOR CARRYING OUT THE INVENTION

Figure 1:
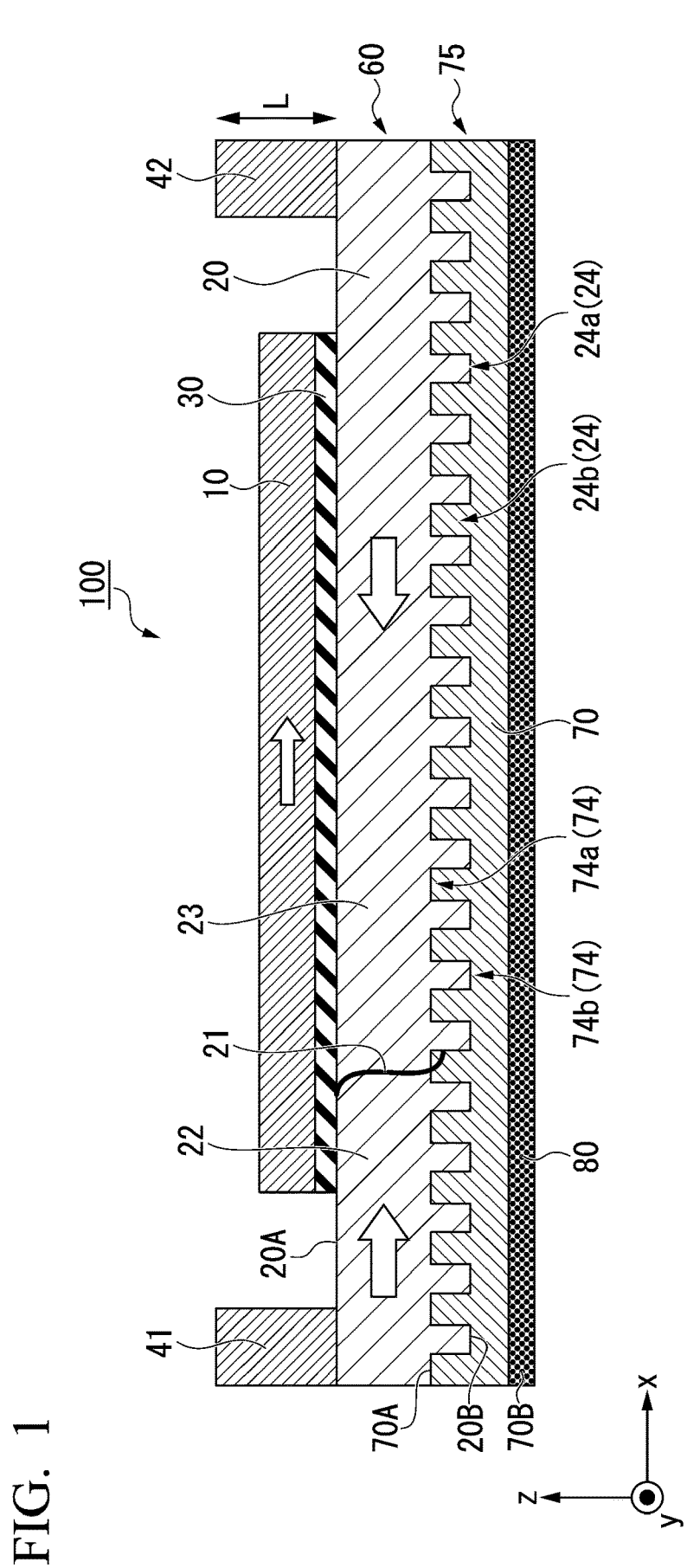
FIG. 1 is a cross-sectional view schematically showing a magnetic domain wall movement type magnetic recording element according to a first embodiment.

Hereinafter, embodiments will be described in detail with reference to the drawings as appropriate. In the drawings used in the following description, in order to make the characteristics of this invention easy to understand, parts which become features may be enlarged for convenience, and dimensional ratios and the like of the respective components may be different from actual ones. The materials, dimensions, and the like exemplified in the following description are merely examples, and the present invention is not limited thereto and can be implemented with appropriate modifications within a range in which effects of the present invention are exhibited.

(Magnetic Domain Wall Movement Type Magnetic Recording Element)

First Embodiment

FIG. 1 is a cross-sectional view schematically showing a magnetic domain wall movement type magnetic recording element 100 according to a first embodiment. The magnetic domain wall movement type magnetic recording element 100 includes a recording part 60 and a control part 75. The recording part 60 includes a first ferromagnetic layer 10, a magnetic recording layer 20, and a non-magnetic layer 30. The recording part 60 is a part for writing and reading data. The control part 75 has a base body 80 and an intermediate body (a planarization layer) 70. The control part 75 is a part provided for forming a concave-convex structure which controls movement of a magnetic domain wall 21 of the recording part 60. The control part 75 indirectly controls the magnetic domain wall 21 of the recording part 60, but the control part 75 does not actively control the movement of the magnetic domain wall 21. The magnetic domain wall movement type magnetic recording element 100 shown in FIG. 1 includes a first electrode 41 and a second electrode 42 at positions which sandwich the first ferromagnetic layer 10 when seen in a lamination direction of the first ferromagnetic layer 10.

Hereinafter, a first direction in which the magnetic recording layer 20 extends is defined as an x direction, a second direction orthogonal to the x direction in a plane in which the magnetic recording layer 20 extends is defined as a y direction, and a third direction orthogonal to the x direction and the y direction is defined as a z direction. The lamination direction of the magnetic domain wall movement type magnetic recording element 100 shown in FIG. 1 coincides with the z direction. Further, in the specification, the expression "extending in the x direction" means, for example, that a dimension in the x direction is larger than a minimum dimension among dimensions in the x, y, and z directions. The same applies to the case of extending in other directions.

"Recording Part"

<First Ferromagnetic Layer>

The first ferromagnetic layer 10 includes a ferromagnetic body. For example, the first ferromagnetic layer 10 includes a plurality of layers. Examples of a ferromagnetic material constituting the first ferromagnetic layer 10 include a metal selected from the group consisting of Cr, Mn, Co, Fe and Ni, an alloy containing at least one of these metals, an alloy containing these metals and at least one element of B, C, and N, and the like. Specifically, Co—Fe, Co—Fe—B, Ni—Fe, $CoHo_2$, $SmFe_{12}$ and the like can be used.

The material forming the first ferromagnetic layer 10 may be a Heusler alloy. The Heusler alloy is a half-metal and has a high spin polarization. The Heusler alloy is an intermetallic compound having a chemical composition of XYZ or $X_2YZ$, X is a Co—, Fe—, Ni—, or Cu-group transition metal element on the periodic table or a noble metal element, Y is a Mn—, V—, Cr— or Ti-group transition metal or an element represented by X, and Z is a typical element of group III to group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$, and the like.

The first ferromagnetic layer 10 may be an in-plane magnetization film having an easy magnetization axis in an in-xy plane direction or may be a perpendicular magnetization film having an easy magnetization axis in the z direction. In FIG. 1, the first ferromagnetic layer 10 is assumed to be an in-plane magnetization film.

When the easy magnetization axis of the first ferromagnetic layer 10 is set in the z direction (a perpendicular magnetization film), a thickness of the first ferromagnetic layer 10 is preferably 1.0 nm or more and 2.5 nm or less and more preferably 1.0 nm or more and 2.0 nm or less. When the first ferromagnetic layer 10 is formed to be thin, the first ferromagnetic layer 10 has perpendicular magnetic anisotropy (interface perpendicular magnetic anisotropy) due to an influence of an interface between the first ferromagnetic layer 10 and another layer (the non-magnetic layer 30).

<Magnetic Recording Layer>

The magnetic recording layer 20 faces the first ferromagnetic layer 10. Here, the term "facing" means opposing another layer and includes a case in which another layer is interposed therebetween. The magnetic recording layer 20 sandwiches the first ferromagnetic layer 10 and the non-magnetic layer 30. The magnetic recording layer 20 is laminated on one side (the lower side in FIG. 1) of the first ferromagnetic layer 10. The magnetic recording layer 20 extends in a first direction (the x direction in FIG. 1) which intersects a lamination direction L. The magnetic recording layer 20 has, for example, a rectangular shape which has a major axis in the x direction and a minor axis in the y direction in plan view in the z direction.

The magnetic recording layer 20 has a first surface 20A which faces the non-magnetic layer 30, and a second surface 20B which is opposite to the first surface 20A. The magnetic recording layer 20 has a concave-convex structure 24 which traps the magnetic domain wall 21 on the second surface 20B. The first surface 20A has a smaller arithmetic average roughness (Ra) or arithmetic surface roughness than the second surface 20B and is flat. The arithmetic average roughness (Ra) is a value obtained by extracting a reference length in a direction of an average line from a roughness curve obtained by measuring the first surface 20A or the second surface 20B and summing and averaging absolute values of deviations from the average line of the extracted portion to the measure curve. The roughness curves of the first surface 20A and the second surface 20B are measured along the x direction. The average line is an average position of a height in the z direction and extends in the x direction. The arithmetic surface roughness is a parameter obtained by extending the arithmetic average roughness (Ra) in a surface direction and is an average of absolute values of height differences of respective points with respect to an average surface of the surface. A magnetic potential energy at a convex portion 24a is lower than that at a concave portion 24b. The magnetic domain wall 21 is easily trapped by the convex portion 24a.

The convex portions 24a and the concave portions 24b are periodically (equally spaced) or irregularly disposed in the x direction when seen in the z direction. When the convex portions 24a and the concave portions 24b are periodically disposed in the x direction (refer to FIG. 1), the magnetic domain walls 21 are trapped at predetermined intervals. As a result, the magnetic domain wall movement type magnetic recording element 100 can easily perform multi-valued data recording.

Figure 2:
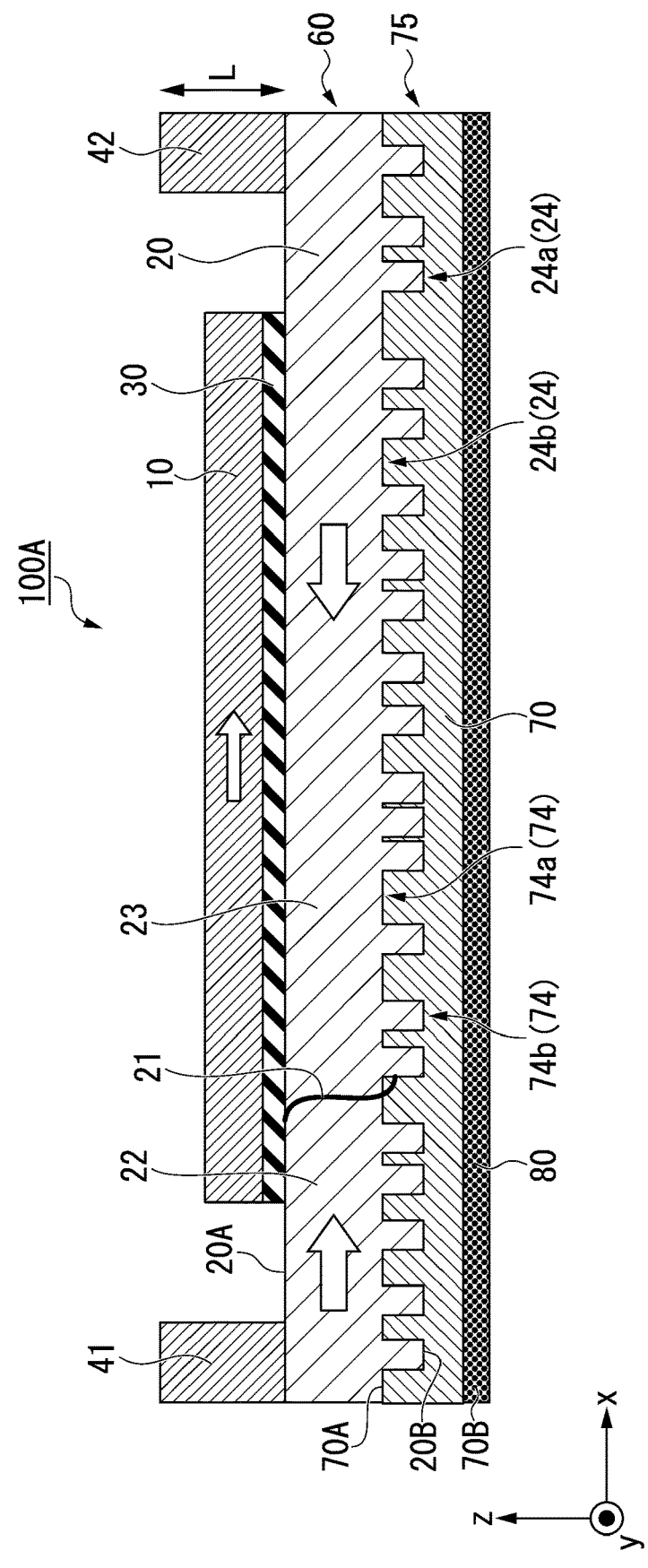
FIG. 2 is an xz sectional view schematically showing a modified example of the magnetic domain wall movement type magnetic recording element according to the first embodiment.

FIG. 2 is a diagram schematically showing an xz cross section of another example of the magnetic domain wall movement type magnetic recording element according to the first embodiment. In a magnetic domain wall movement type magnetic recording element 100A shown in FIG. 2, a distance in the x direction between the adjacent convex portions 24a is not constant, and widths of the convex portions 24a in the x direction are also different from each other. The convex portions 24a and the concave portions 24b are disposed irregularly in the x direction. When the convex portions 24a and the concave portions 24b are disposed irregularly in the x direction, the magnetic domain wall 21 is trapped irregularly, and the movement of the magnetic domain wall 21 becomes gentle. As a result, the magnetic domain wall movement type magnetic recording element 100 can easily record data in an analog manner.

Figure 3:
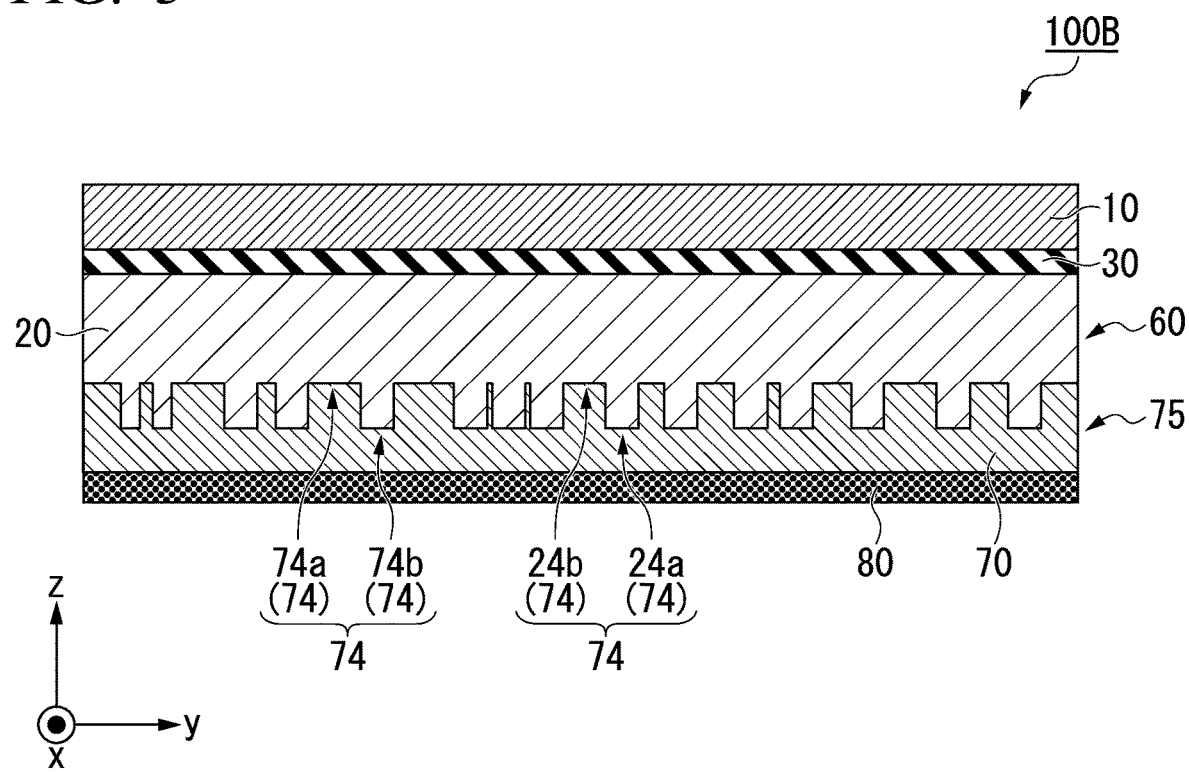
FIG. 3 is a yz sectional view schematically showing a modified example of the magnetic domain wall movement type magnetic recording element according to the first embodiment.

Further, FIG. 3 is a diagram schematically showing a yz cross section of another example of the magnetic domain wall movement type magnetic recording element according to the first embodiment. In a magnetic domain wall movement type magnetic recording element 100B shown in FIG. 3, a distance in the y direction between adjacent convex portions 24a is not constant, and widths of the convex portions 24a in the y direction are different from each other. The convex portions 24a and the concave portions 24b are disposed irregularly in the y direction. As shown in FIG. 3, the convex portions 24a and the concave portions 24b may be disposed irregularly in the y direction, there being no limitation to the x direction.

Figure 4:
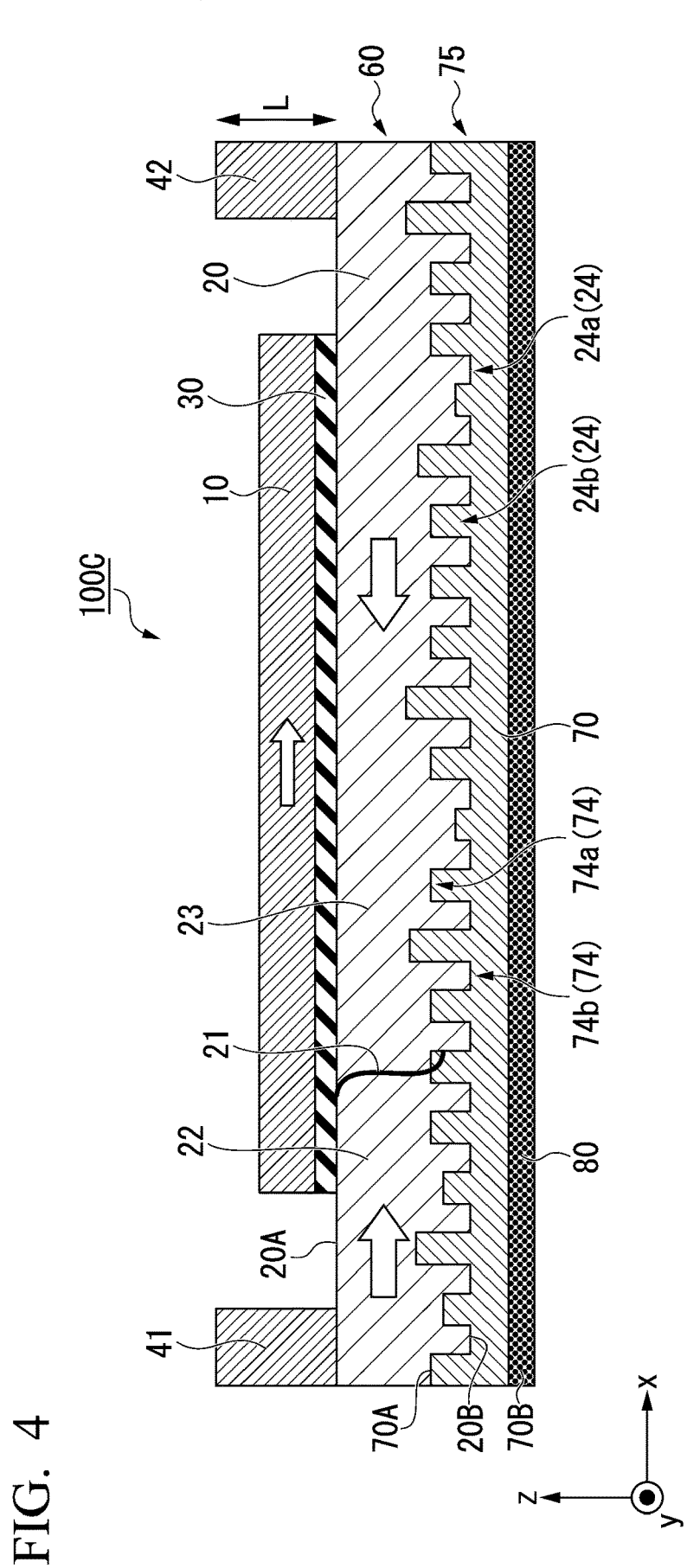
FIG. 4 is an xz sectional view schematically showing a modified example of the magnetic domain wall movement type magnetic recording element according to the first embodiment.

Also, FIG. 4 is a diagram schematically showing an xz cross section of another example of the magnetic domain wall movement type magnetic recording element according to the first embodiment. In a magnetic domain wall movement type magnetic recording element 100C shown in FIG. 4, a height of each of the convex portions 24a in the z direction is not constant. As shown in FIG. 4, the height or depth of each of the convex portions 24a and the concave portions 24b may be irregular in the z direction, there being no limitation to the x direction.

The magnetic recording layer 20 can have the magnetic domain wall 21 inside. The magnetic domain wall 21 is a boundary between a first magnetic domain 22 and a second magnetic domain 23 having magnetizations in directions opposite to each other. When two magnetic domains are formed inside, the magnetic recording layer 20 has the magnetic domain wall 21 inside. In the magnetic domain wall movement type magnetic recording element 100 shown in FIG. 1, the first magnetic domain 22 has a magnetization oriented in the +x direction, and the second magnetic domain 23 has a magnetization oriented in the −x direction.

The magnetic domain wall movement type magnetic recording element 100 records data in a multi-valued or analog manner according to a position of the magnetic domain wall 21 of the magnetic recording layer 20. Data recorded on the magnetic recording layer 20 is read as a change in resistance values of the first ferromagnetic layer 10 and the magnetic recording layer 20 in the lamination direction. When the magnetic domain wall 21 moves, the ratio between the first magnetic domain 22 and the second magnetic domain 23 in the magnetic recording layer 20 changes. The magnetization of the first ferromagnetic layer 10 is in the same direction as (parallel to) the magnetization of the first magnetic domain 22 and is in a direction opposite (anti-parallel) to the magnetization of the second magnetic domain 23. When the magnetic domain wall 21 moves in the x direction and an area of the first magnetic domain 22 in a portion which overlaps the first ferromagnetic layer 10 when seen in the z direction increases, the resistance value of the magnetic domain wall movement type magnetic recording element 100 decreases. Conversely, when the magnetic domain wall 21 moves in the −x direction and an area of the second magnetic domain 23 in a portion which overlaps the first ferromagnetic layer 10 when seen in the z direction increases, the resistance value of the magnetic domain wall movement type magnetic recording element 100 increases.

The magnetic domain wall 21 moves by causing a current to flow in a direction in which the magnetic recording layer 20 extends or by applying an external magnetic field. For example, when a current pulse is applied from the first electrode 41 to the second electrode 42, the first magnetic domain 22 spreads in a direction of the second magnetic domain 23, and the magnetic domain wall 21 moves in the direction of the second magnetic domain 23. That is, the position of the magnetic domain wall 21 is controlled by setting a direction and intensity of the current flowing through the first electrode 41 and the second electrode 42, and data is written to the magnetic domain wall movement type magnetic recording element 100.

The magnetic recording layer 20 is configured of a magnetic body. The same magnetic body as that of the first ferromagnetic layer 10 can be used for the magnetic body constituting the magnetic recording layer 20. Further, the magnetic recording layer 20 preferably contains at least one element selected from the group consisting of Co, Ni, Pt, Pd, Gd, Tb, Mn, Ge, and Ga. For example, a laminated film of Co and Ni, a laminated film of Co and Pt, a laminated film of Co and Pd, a MnGa-based material, a GdCo-based material, and a TbCo-based material can be used. Ferrimagnetic bodies such as MnGa-based materials, GdCo-based materials, and TbCo-based materials have a small saturation magnetization and can reduce a threshold current required for moving a magnetic domain wall. Furthermore, the laminated film of Co and Ni, the laminated film of Co and Pt, and the laminated film of Co and Pd have a large coercivity and can curb a movement speed of the magnetic domain wall.

<Non-Magnetic Layer>

The non-magnetic layer 30 is sandwiched between the first ferromagnetic layer 10 and the magnetic recording layer 20. A known material can be used for the non-magnetic layer 30. For example, when the non-magnetic layer 30 is made of an insulator (when it is a tunnel barrier layer), a material thereof may be $Al_2O_3$, $SiO_2$, MgO, $MgAl_2O_4$, or the like. In addition, materials in which Al, Si, and Mg are partially replaced by Zn, Be, or the like can be used as the non-magnetic layer 30. Among them, MgO and $MgAl_2O_4$ are materials capable of realizing coherent tunneling, and spin can be implanted efficiently. When the non-magnetic layer 30 is made of a metal, Cu, Au, Ag, or the like can be used as the material thereof. Furthermore, when the non-magnetic layer 30 is made of a semiconductor, the material thereof may be Si, Ge, $CuInSe_2$, $CuGaSe_2$, $Cu(In, Ga)Se_2$, or the like.

<First Electrode, Second Electrode>

The first electrode 41 and the second electrode 42 are disposed at positions which sandwich the first ferromagnetic layer 10 in the x direction when seen in the z direction. The first electrode 41 and the second electrode 42 may be made of a conductive material such as Cu, Al, and Au. Further, the first electrode 41 may be a ferromagnetic body in which the magnetization is oriented in the x direction, and the second electrode 42 may be a ferromagnetic body in which the magnetization is oriented in the −x direction. When a current passes through the first electrode 41 or the second electrode 42, the current is spin-polarized. When the spin-polarized current is applied to the magnetic recording layer 20, the ratio between the first magnetic domain 22 and the second magnetic domain 23 of the magnetic recording layer 20 changes.

The first electrode 41 and the second electrode 42 may be replaced with spin-orbit torque wiring. For example, spin-orbit torque wiring which extends in the y direction is arranged at the positions of the first electrode 41 and the second electrode 42. When a current flows through the spin-orbit torque wiring, a spin Hall effect occurs in the spin-orbit torque wiring. When the spin polarized by the spin Hall effect flows into the magnetic recording layer 20, the ratio between the first magnetic domain 22 and the second magnetic domain 23 of the magnetic recording layer 20 changes. Both the first electrode 41 and the second electrode 42 may be replaced with the spin-orbit torque wiring, or only one thereof may be replaced. When both are replaced with the spin-orbit torque wiring, the direction of current flowing is reversed.

The first electrode 41 and the second electrode 42 may not be provided. In this case, the magnetic domain wall of the magnetic recording layer 20 is moved by an external magnetic field.

"Control Part"

<Intermediate Body (Planarization Layer)>

The intermediate body 70 is located between the base body 80 and the magnetic recording layer 20. The intermediate body 70 fills the concave-convex structure 24 on the second surface 20B of the magnetic recording layer 20 and makes it flat. When seen from the magnetic recording layer 20, the intermediate body 70 can be regarded as a planarization layer.

The intermediate body 70 shown in FIG. 1 is a layer having concavity and convexity on a first surface 70A on a second surface 20B side of the magnetic recording layer 20. The first surface 70A of the intermediate body 70 has a concave-convex structure 74 including a convex portion 74a and a concave portion 74b. The magnetic recording layer 20 is laminated on the first surface 70A of the intermediate body 70. The concave-convex structure 24 of the magnetic recording layer 20B is formed by the concave-convex structure 74 on the first surface 70A of the intermediate body 70. The convex portion 74a of the intermediate body 70 corresponds to the concave portion 24b of the magnetic recording layer 20, and the concave portion 74b of the intermediate body 70 corresponds to the convex portion 24a of the magnetic recording layer 20.

The intermediate body 70 shown in FIG. 1 is a non-magnetic body. The intermediate body 70 shown in FIG. 1 is an example of a trap-reinforcing member which will be described later. When a surface of the base body 80 is formed of an insulator, the intermediate body 70 may be a conductor or an insulator. When the surface of the base body 80 is a conductor, the intermediate body 70 is preferably an insulator. When the intermediate body 70 has an insulating property, a current flowing between the first electrode 41 and the second electrode 42 can be prevented from flowing through a portion other than the magnetic recording layer 20. When resistance of the intermediate body 70 is sufficiently higher than that of the magnetic recording layer 20, a conductor, a semiconductor, or the like may be used for the intermediate body 70.

A thickness of the intermediate body 70 is preferably 20 nm or less, more preferably 10 nm or less, and even more preferably 5 nm or less. The thickness of the intermediate body 70 is preferably 2 nm or more. Here, the thickness of the intermediate body 70 is a distance between an average height position of the first surface 70A and the second surface 70B of the intermediate body 70. The average height position is a position obtained by averaging the height positions of concavity and convexity on the first surface 70A and can be confirmed by a transmission electron microscope. When the thickness of the intermediate body 70 is within the above-described range, the concave-convex structure 74 having a sufficient concave-convex difference on the first surface 70A of the intermediate body 70 can be formed.

Figure 5:
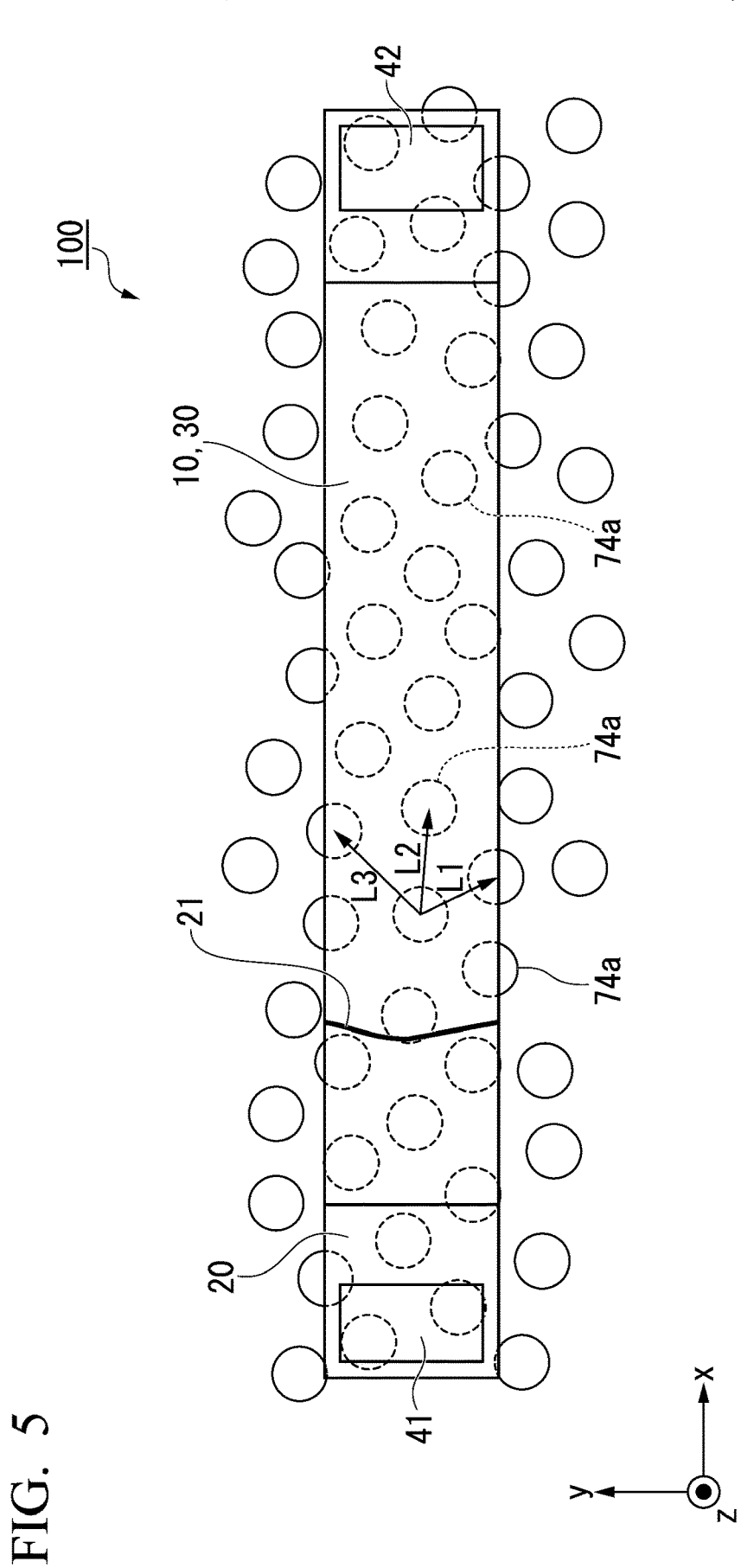
FIG. 5 is a plan view schematically showing the magnetic domain wall movement type magnetic recording element according to the first embodiment.

FIG. 5 is a plan view schematically showing the magnetic domain wall movement type magnetic recording element 100 according to the first embodiment. In FIG. 5, the convex portions 74a of the intermediate body 70 are irregularly disposed in a xy plane. Here, the term "irregular" in this specification means that a distance between vertices of the adjacent convex portions 74a is not constant. The fact that the distance between the vertices of the adjacent convex portions 74a is not constant is obtained as follows. First, the distances L1, L2, L3, . . . between the vertices of the convex portions 74a located at positions which overlaps the magnetic recording layer 20 are determined. Then, a most frequent value of the distances between the vertices of the convex portions 74a is obtained. When each of the distances L1, L2, L3, . . . between the vertices of the convex portions 74a is within a range of ±5% of the most frequent value, the distances between the vertices of the adjacent convex portion 74a are considered to be constant. Conversely, when the condition is not satisfied, it can be determined that the distances between the vertices of the adjacent convex portions 74a are not constant and the convex portions 74a are irregularly disposed in the xy plane. The magnetic recording layer 20, the non-magnetic layer 30, and the first ferromagnetic layer 10 are sequentially laminated on the intermediate body 70. The convex portion 24a and the concave portion 24b of the magnetic recording layer 20 are formed irregularly. FIG. 5 shows an example in which the convex portions 74a of the intermediate body 70 are irregular, but the convex portions 74a of the intermediate body 70 may be disposed regularly.

<Base Body>

The base body 80 has, for example, a substrate and an underlayer laminated on one surface of the substrate on the intermediate body 70 side. The substrate is, for example, a semiconductor substrate such as silicon. The base body 80 may have only the substrate without the underlayer.

<Underlayer>

The underlayer is, for example, Fe, Cu, Ni, Co, Si, $SiO_2$, $Al_2O_3$, MgO, or the like. The concavity and convexity on the first surface 70A of the intermediate body 70 are formed in relation to the underlayer. For example, crystal growth of the intermediate body 70 becomes granular due to the underlayer, and the concavity and convexity are formed on the first surface 70A of the intermediate body 70. In addition, for example, the concavity and convexity are formed on the first surface 70A of the intermediate body 70 using the difference in surface energy between the underlayer and the intermediate body 70.

Next, an example of a method for manufacturing the magnetic domain wall movement type magnetic recording element 100 according to the first embodiment will be described with reference to FIGS. 6A to 6F.

Figure 6A:
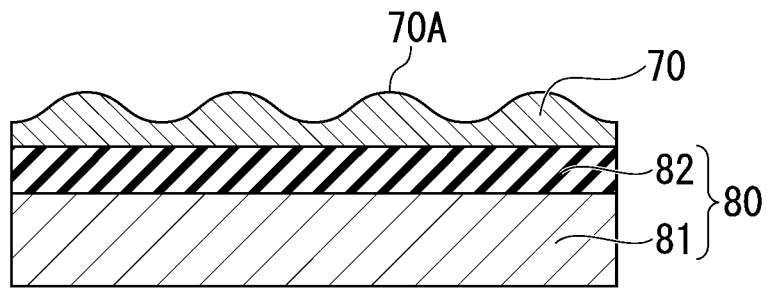
FIG. 6A is an explanatory diagram of one example of a method for manufacturing the magnetic domain wall movement type magnetic recording element according to the first embodiment.

First, the base body 80 is prepared. The base 80 has a substrate 81 and an underlayer 82. Then, as shown in FIG. 6A, the intermediate body 70 is formed on one surface of the underlayer 82. The intermediate body 70 is laminated by, for example, a sputtering method, a chemical vapor deposition (CVD) method, or the like. The first surface 70A of the intermediate body 70 has concavity and convexity in relation to the underlayer 82. For example, when a crystal of the intermediate body 70 and a crystal of the underlayer 82 have different lattice constants, a crystal structure is disturbed to reduce the difference in the lattice constant, and the concavity and convexity are formed on the first surface 70A. Also, for example, when there is a difference in surface energy between the underlayer 82 and the intermediate body 70, the concavity and convexity are formed on the first surface 70A. For example, atoms constituting the intermediate body 70 sputtered on one surface of the underlayer 82 aggregate with each other due to the difference in the surface energy. The atoms which are aggregated together are scattered in an island shape. When film formation of the intermediate body 70 is continued, the islands are combined with each other, and the intermediate body 70 having the concavity and convexity on the first surface 70A is formed. The positions in the x direction and the positions in the y direction of the convex portions of the concavity and convexity formed on the first surface 70A may be regular or irregular, and the heights of the convex portions in the z direction may be constant or different.

Figure 6B:
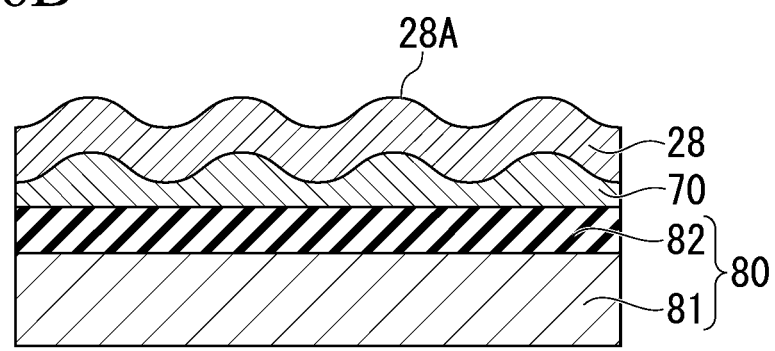
FIG. 6B is an explanatory diagram of one example of the method for manufacturing the magnetic domain wall movement type magnetic recording element according to the first embodiment.

Next, as shown in FIG. 6B, a magnetic body 28 is laminated on one surface of the intermediate body 70. A first surface 28A of the magnetic body 28 has concavity and convexity which reflect a shape of the first surface 70A of the intermediate body 70.

Figure 6C:
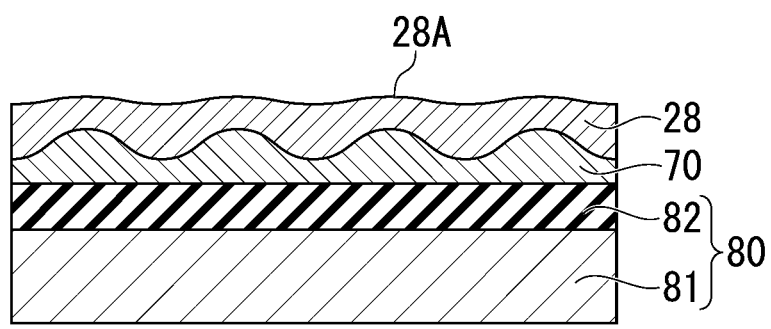
FIG. 6C is an explanatory diagram of one example of the method for manufacturing the magnetic domain wall movement type magnetic recording element according to the first embodiment.

Further, as shown in FIG. 6C, anisotropic sputtering may be performed when the magnetic body 28 is laminated. The anisotropic sputtering is a method in which ions are sputtered to a film-forming object (the intermediate body 70) in an oblique direction. When ions are supplied in an oblique direction, a film forming speed changes in a plane of the film-forming body (the intermediate body 70), and the first surface 28A of the magnetic body 28 is planarized with respect to the first surface 70A of the intermediate body 70.

Figure 6D:
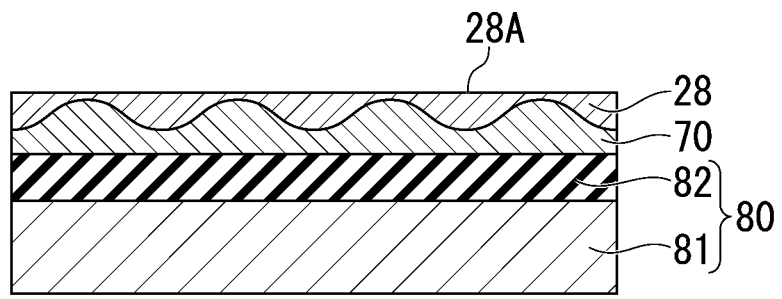
FIG. 6D is an explanatory diagram of one example of the method for manufacturing the magnetic domain wall movement type magnetic recording element according to the first embodiment.

Next, as shown in FIG. 6D, the first surface 28A of the magnetic body 28 is planarized. The planarization is performed by, for example, chemical mechanical polishing, dry etching, wet etching, or the like. As shown in FIG. 6C, when the anisotropic sputtering is performed, a process in which the first surface 28A is planarized may not be performed.

Figure 6E:
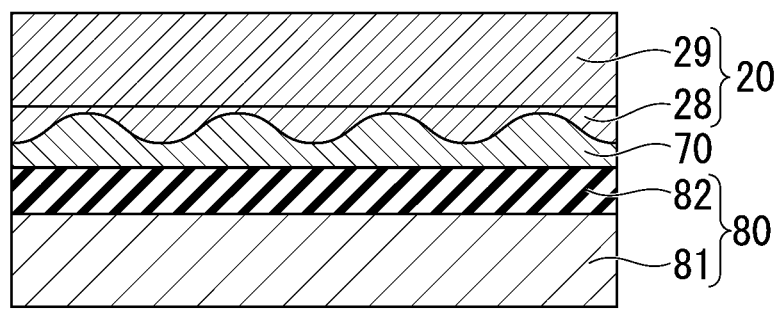
FIG. 6E is an explanatory diagram of one example of the method for manufacturing the magnetic domain wall movement type magnetic recording element according to the first embodiment.

Next, as shown in FIG. 6E, a magnetic body 29 is laminated on the first surface 28A of the magnetic body 28. The magnetic body 28 and the magnetic body 29 are the same. The magnetic body 28 and the magnetic body 29 are combined to form the magnetic recording layer 20.

Figure 6F:
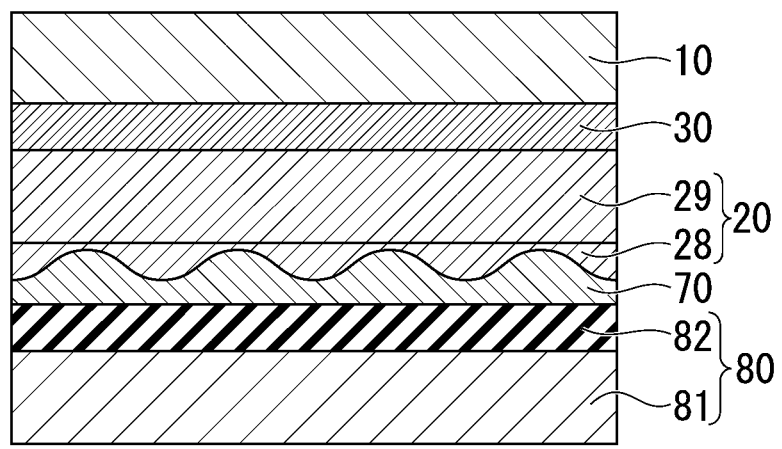
FIG. 6F is an explanatory diagram of one example of the method for manufacturing the magnetic domain wall movement type magnetic recording element according to the first embodiment.

Next, as shown in FIG. 6F, the non-magnetic layer 30 and the first ferromagnetic layer 10 are sequentially laminated on one surface of the magnetic recording layer 20. Then, unnecessary portions of the non-magnetic layer 30 and the first ferromagnetic layer 10 are removed by photolithography or the like. With such a procedure, the magnetic domain wall movement type magnetic recording element 100 according to the first embodiment can be manufactured.

As described above, since the magnetic domain wall movement type magnetic recording element 100 according to the first embodiment has the concave-convex structure 24 on a surface of the magnetic recording layer 20 on the back surface side (the side opposite to the first ferromagnetic layer 10), and the concave-convex structure 24 serves as a trap site for the magnetic domain wall 21, controllability of the movement of the magnetic domain wall 21 can be improved. Further, the second surface 20B on which the concave-convex structure 24 is formed corresponds to a back surface of the first surface 20A on which the first ferromagnetic layer 10 is laminated, and has little effect on the MR ratio of the magnetic domain wall movement type magnetic recording element 100. That is, noise of the magnetic domain wall movement type magnetic recording element 100 can be curbed.

Further, when a trap site is separately provided around the magnetic recording layer 20, it is necessary to maintain a predetermined distance between the magnetic recording layer 20 and the trap site due to a process restriction. On the other hand, in the embodiment, the back surface of the magnetic recording layer 20 is the trap site, the magnetic domain wall 21 can be trapped at a closer position than a case in which the trap site is provided around the magnetic recording layer 20, and thus the controllability of the movement of the magnetic domain wall 21 can be further improved. Further, when the trap site is provided on a side surface of the magnetic recording layer 20, the concavity and convexity in which a difference between the concavity and convexity is about a few tens of nm are formed on the side surface due to a problem of processing accuracy of photolithography or the like. In other words, an extra space of about a few tens of nm is required outside the first ferromagnetic layer 10. On the other hand, the magnetic domain wall movement type magnetic recording element 100 according to the embodiment has the trap site in the z direction and does not require an extra space in the xy directions.

Further, since the magnetic domain wall movement type magnetic recording element 100 according to the embodiment does not have the concave-convex structure 24 on the surface side (the first ferromagnetic layer 10 side), a problem that noise is generated when a density of a current flowing on the surface side becomes discontinuous in the concave-convex structure can be avoided.

Further, the magnetic domain wall movement type magnetic recording element 100 according to the embodiment does not require physical processing of the first ferromagnetic layer in the manufacturing process and can also avoid a problem that noise is generated at the time of operation due to an effect of processing damage.

Although an example of the first embodiment has been described in detail, the first embodiment is not limited to this example, and various modifications and changes may be made within the scope of the present invention described in the appended claims.

Figure 7:
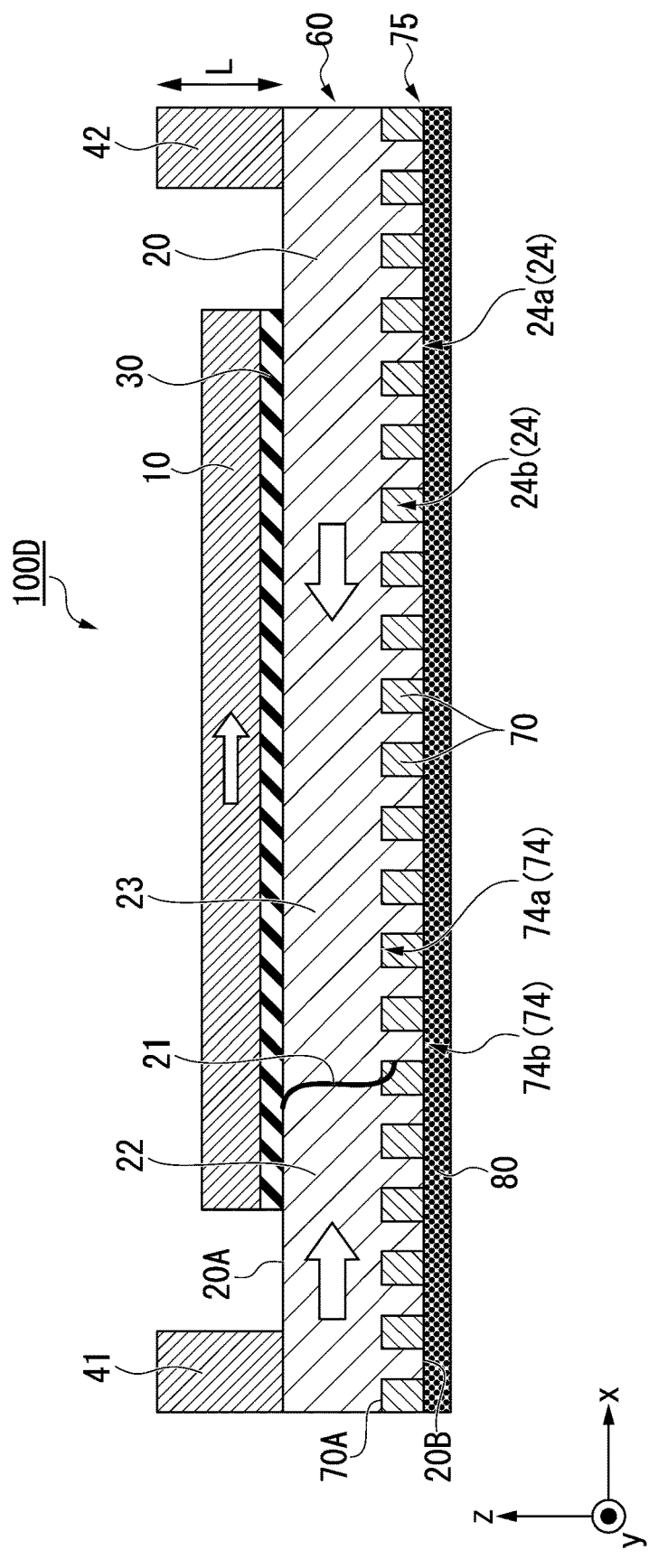
FIG. 7 is a cross-sectional view schematically showing a modified example of the magnetic domain wall movement type magnetic recording element according to the first embodiment.

FIG. 7 is a cross-sectional view schematically showing Modified Example 1 of the magnetic domain wall movement type magnetic recording element according to the first embodiment. A magnetic domain wall movement type magnetic recording element 100D according to Modified Example 1 is different from the magnetic domain wall movement type magnetic recording element 100 shown in FIG. 1 in that the intermediate body 70 has no layer formed and is scattered on one surface of the base body 80. Also in this case, the second surface 20B of the magnetic recording layer 20 has the concave-convex structure 24, and the same effect as in the magnetic domain wall movement type magnetic recording element 100 can be obtained.

The magnetic domain wall movement type magnetic recording element 100D according to Modified Example 1 is manufactured by stopping the film formation of the intermediate body 70 before the islands are combined when the intermediate body 70 is laminated.

Second Embodiment

Figure 8:
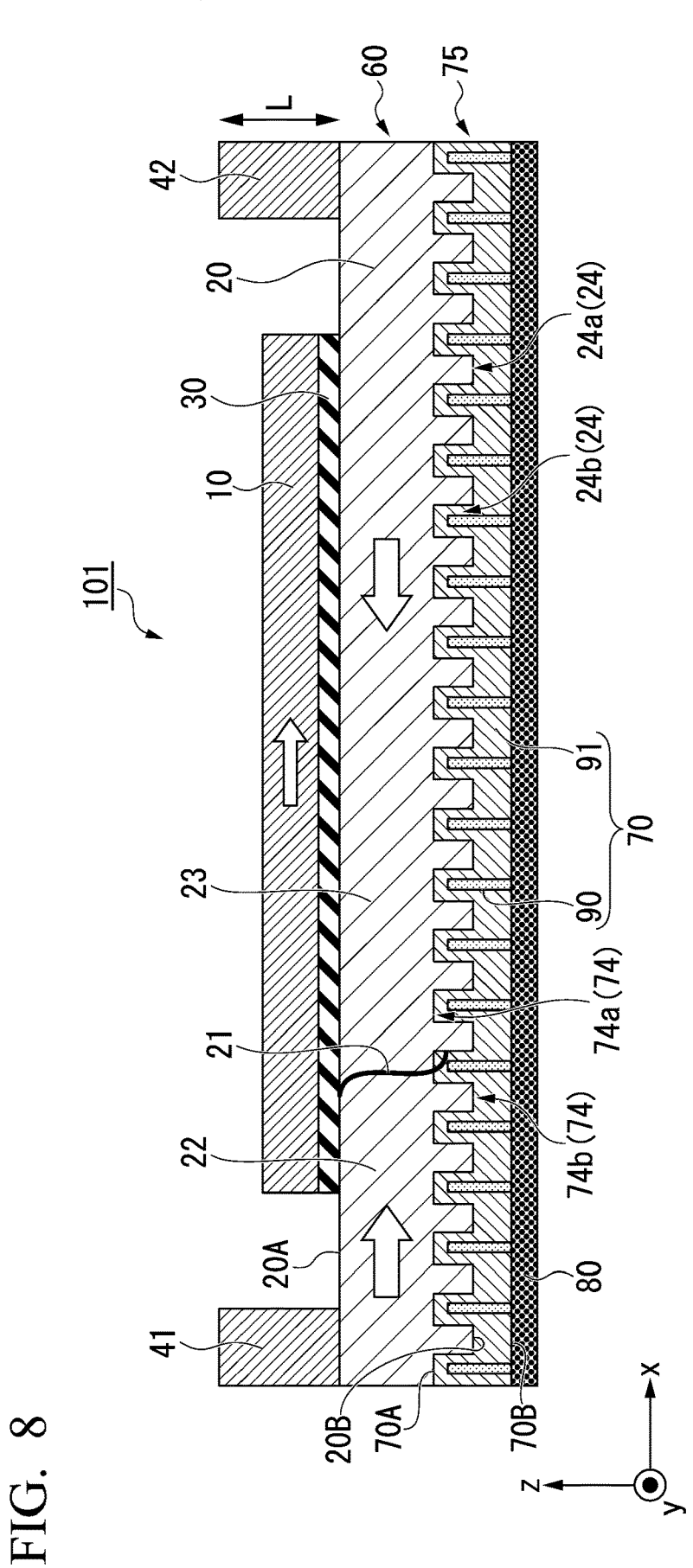
FIG. 8 is a cross-sectional view schematically showing a magnetic domain wall movement type magnetic recording element according to a second embodiment.

FIG. 8 is a schematic cross-sectional view of a magnetic domain wall movement type magnetic recording element according to a second embodiment. The magnetic domain wall movement type magnetic recording element 101 shown in FIG. 8 is different from the magnetic domain wall movement type magnetic recording element 100 shown in FIG. 1 in that the intermediate body 70 includes a trap-reinforcing member 90 and an insulating layer 91 which covers the trap-reinforcing member 90 from a position near the base body 80. The same parts as those of the magnetic domain wall movement type magnetic recording element 100 are designated by the same reference numerals, and description thereof will be omitted.

In FIG. 8, the trap-reinforcing member 90 is scattered on one surface of the base body 80. The trap-reinforcing member 90 may be made of a non-magnetic material such as Ta, Al, or Cu, or may be made of a magnetic material such as Ni, Fe, or Co. When the trap-reinforcing member 90 is made of a non-magnetic material, the difference in magnetic potential energy can be clarified between the convex portion 24a and the concave portion 24b in the concave-convex structure 24 of the magnetic recording layer, and a magnetic domain wall trapping function can be enhanced. Further, when the trap-reinforcing member 90 is made of a magnetic material, the magnetic domain wall 21 can be trapped more strongly by magnetically coupling with the magnetization of the magnetic recording layer 20, as compared with the case in which the trap-reinforcing member 90 is made of a non-magnetic material.

When a film is formed by sputtering a material to form the insulating layer 91 after \the trap-reinforcing member 90 is formed, according to film forming conditions, the ratio of the thickness of a planarization material to be formed can be adjusted at an upper surface and a side surface of the trap-reinforcing member 90. At this time, the ratio between the width of the trap-reinforcing member 90 and the thickness of the planarization material is 1:1 to 2:1. Therefore, in an extending direction (the x direction) of the magnetic recording element 20, the width of the trap-reinforcing member 90 is about 0.3 to 0.5 times the width of the concave portion 24b.

The insulating layer 91 covers the surface of the trap-reinforcing member 90 scattered in an island shape. The insulating layer 91 is formed by reflecting surface shapes of the base body 80 and the trap-reinforcing member 90. Therefore, the concave-convex structure 74 including the convex portion 74a and the concave portion 74b is formed on the first surface 70A of the intermediate body 70. Since the magnetic recording layer 20 is formed on the first surface 70A of the intermediate body 70, the second surface 20B has the concave-convex structure 24.

In the insulating layer 91, at least a portion between an inner wall of the concave portion 24b and the trap-reinforcing member 90 has insulating properties. The insulating layer 91 preferably has insulating properties as a whole. The insulating layer 91 electrically separates the magnetic recording layer 90 from the base body 80. The base body 80 is formed on the side of the intermediate body 70 opposite to the magnetic recording layer 20. The base body 80 is in contact with one end of the trap-reinforcing member 90.

When a surface energy of a material constituting the surface of the base body 80 is $\gamma_A$, and a surface energy of a material of the trap-reinforcing member 90 is $\gamma_B$, $\gamma_B < \gamma_A$, and a surface energy mismatch $\Gamma_{AB}$ defined by the following Equation (1) is preferably larger than 0.5. Here, the material constituting the surface of the base body 80 is a material which constitutes the underlayer when the base body 80 is formed of the substrate and the base layer, and the material is a material which constitutes the substrate when the base body 80 is formed of the substrate. In the first embodiment, the material constituting the intermediate body 70 and the material constituting the surface of the base body 80 also preferably satisfy the same relationship.

[Math 2]

$$\Gamma_{AB} = 2\left|\frac{\gamma_A - \gamma_B}{\gamma_A + \gamma_B}\right| \tag{2}$$

When the surface energy of the surface of the base body 80 and the surface energy of the trap-reinforcing member 90 satisfy the above relationship, the trap-reinforcing member 90 grows in an island shape only by performing a film forming process. In this case, since patterning for forming the trap-reinforcing member 90 is not required, the manufacturing process can be simplified.

Table 1 shows an example of a combination of materials of the surface of the base body 80 and the trap-reinforcing member 90 which satisfies the above relationship.

TABLE 1

| Base body | | Trap-reinforcing member | | |
|---|---|---|---|---|
| Material | $\gamma_A$(mNm$^{-1}$) | Material | $\gamma_B$(mNm$^{-1}$) | $\Gamma_{AB}$ |
| Al | 1085 | SiO$_2$ | 290 | 1.16 |
|  | 1085 | Al$_2$O$_3$ | 580 | 0.61 |
|  | 1085 | MgO | 520 | 0.70 |
| Si | 1107 | SiO$_2$ | 290 | 1.17 |
|  | 1107 | Al$_2$O$_3$ | 580 | 0.62 |
|  | 1107 | MgO | 520 | 0.72 |
| Au | 1616 | SiO$_2$ | 290 | 1.39 |
|  | 1616 | Al$_2$O$_3$ | 580 | 0.94 |
|  | 1616 | MgO | 520 | 1.03 |
|  | 1616 | Al | 1085 | 0.39 |
| Cu | 1934 | SiO$_2$ | 290 | 1.48 |
|  | 1934 | Al$_2$O$_3$ | 580 | 1.08 |
|  | 1934 | MgO | 520 | 1.15 |
|  | 1934 | Al | 1085 | 0.56 |
| Pd | 2043 | SiO$_2$ | 290 | 1.50 |
|  | 2043 | Al$_2$O$_3$ | 580 | 1.12 |
|  | 2043 | MgO | 520 | 1.19 |
|  | 2043 | Al | 1085 | 0.61 |
| Cr | 2056 | SiO$_2$ | 290 | 1.51 |
|  | 2056 | Al$_2$O$_3$ | 580 | 1.12 |
|  | 2056 | MgO | 520 | 1.19 |
|  | 2056 | Al | 1085 | 0.62 |
| Ti | 2570 | SiO$_2$ | 290 | 1.59 |
|  | 2570 | Al$_2$O$_3$ | 580 | 1.26 |
|  | 2570 | MgO | 520 | 1.33 |
|  | 2570 | Al | 1085 | 0.81 |
| Pt | 2691 | SiO$_2$ | 290 | 1.61 |
|  | 2691 | Al$_2$O$_3$ | 580 | 1.29 |
|  | 2691 | MgO | 520 | 1.35 |
|  | 2691 | Al | 1085 | 0.85 |
| Ta | 3018 | SiO$_2$ | 290 | 1.65 |
|  | 3018 | Al$_2$O$_3$ | 580 | 1.36 |
|  | 3018 | MgO | 520 | 1.41 |
|  | 3018 | Al | 1085 | 0.94 |
| Ru | 3409 | SiO$_2$ | 290 | 1.69 |
|  | 3409 | Al$_2$O$_3$ | 580 | 1.42 |
|  | 3409 | MgO | 520 | 1.47 |
|  | 3409 | Al | 1085 | 1.03 |
| Al$_2$O$_3$ | 580 | SiO$_2$ | 290 | 0.67 |
| MgO | 520 | SiO$_2$ | 290 | 0.57 |

Next, an example of a method for manufacturing the magnetic domain wall movement type magnetic recording element 101 according to the second embodiment will be described with reference to FIGS. 9A to 9F.

Figure 9A:
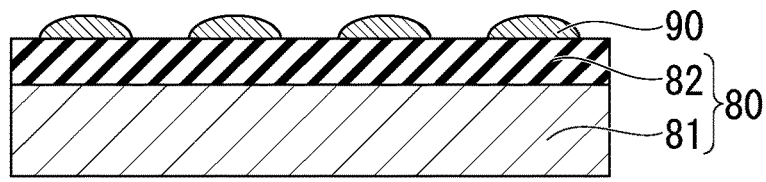
FIG. 9A is an explanatory diagram of one example of a method for manufacturing the magnetic domain wall movement type magnetic recording element according to the second embodiment.

First, the base 80 is prepared. The base 80 includes the substrate 81 and the underlayer 82. Next, as shown in FIG. 9A, the trap-reinforcing member 90 is formed on one surface of the underlayer 82. The trap-reinforcing member 90 is laminated by, for example, a sputtering method, a chemical vapor deposition (CVD) method, or the like. The trap-reinforcing member 90 grows in an island shape. When a film is formed under a condition that the thickness of the trap-reinforcing member 90 is equal to or less than the thickness at which the trap-reinforcing member 90 becomes a layer, the trap-reinforcing member 90 grows into a nucleus and has an island shape. The condition that the thickness of the trap-reinforcing member 90 is equal to or less than the thickness at which the trap-reinforcing member 90 becomes a layer is a condition that is equal to or less than a condition that the trap-reinforcing member 90 theoretically has a thickness corresponding to several atomic layers. Even under the condition of a film having a thickness corresponding to several atomic layers being formed theoretically, the islands which are grown into a nucleus are not actually combined, and thus the trap-reinforcing member 90 is scattered in an island shape. Also, for example, when the trap-reinforcing member 90 is selected in consideration of the difference in the surface energy with respect to the underlayer 82, the trap-reinforcing member 90 is formed in an island shape.

Figure 9B:
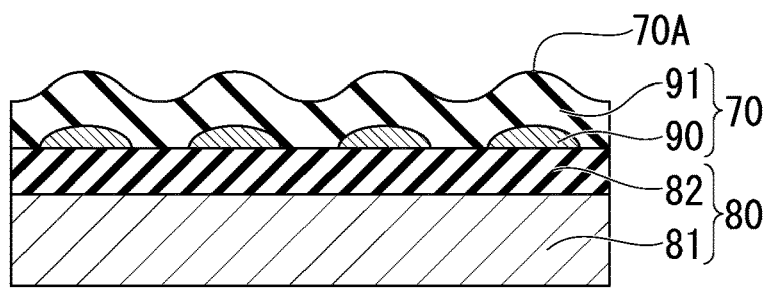
FIG. 9B is an explanatory diagram of one example of the method for manufacturing the magnetic domain wall movement type magnetic recording element according to the second embodiment.

Next, as shown in FIG. 9B, the insulating layer 91 is laminated on one surface of the trap-reinforcing member 90. The insulating layer 91 covers the surfaces of the base body 80 and the trap-reinforcing member 90. As a result, the first surface 70A of the intermediate body 70 has the concavity and convexity.

Figure 9C:
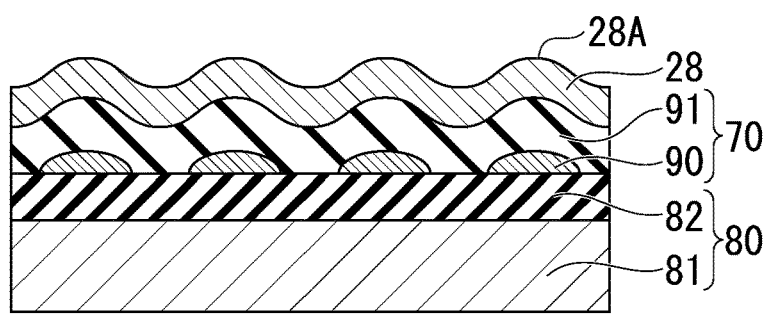
FIG. 9C is an explanatory diagram of one example of the method for manufacturing the magnetic domain wall movement type magnetic recording element according to the second embodiment.

Next, as shown in FIG. 9C, the magnetic body 28 is laminated on one surface of the intermediate body 70. The first surface 28A of the magnetic body 28 has the concavity and convexity which reflect the shape of the first surface 70A of the intermediate body 70.

Figure 9D:
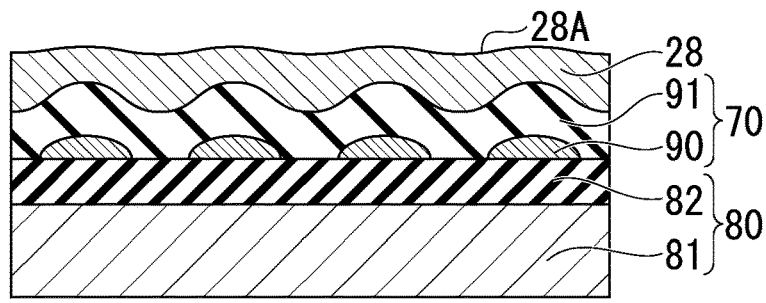
FIG. 9D is an explanatory diagram of one example of the method for manufacturing the magnetic domain wall movement type magnetic recording element according to the second embodiment.

Further, as shown in FIG. 9D, the anisotropic sputtering may be performed when the magnetic body 28 is laminated. The first surface 28A of the magnetic body 28 is planarized with respect to the first surface 70A of the intermediate body 70.

Figure 9E:
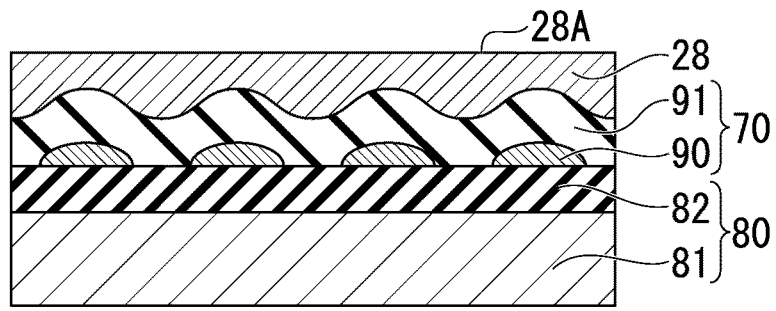
FIG. 9E is an explanatory diagram of one example of the method for manufacturing the magnetic domain wall movement type magnetic recording element according to the second embodiment.

Next, as shown in FIG. 9E, the first surface 28A of the magnetic body 28 is planarized. The planarization is performed by, for example, chemical mechanical polishing, dry etching, wet etching, or the like. As shown in FIG. 9D, when the first surface 28A is planarized by another method, the planarizing process may not be performed.

Figure 9F:
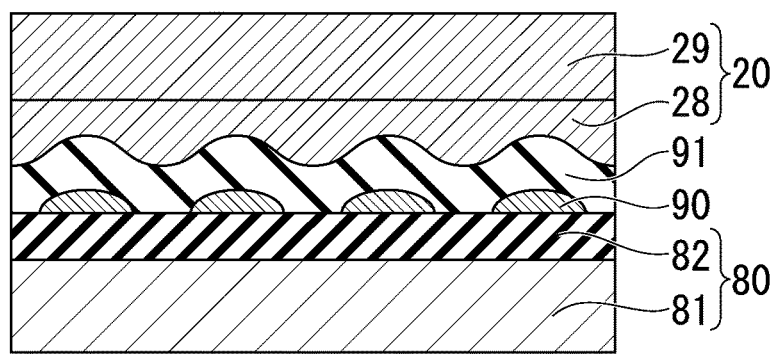
FIG. 9F is an explanatory diagram of one example of the method for manufacturing the magnetic domain wall movement type magnetic recording element according to the second embodiment.
Figure 9G:
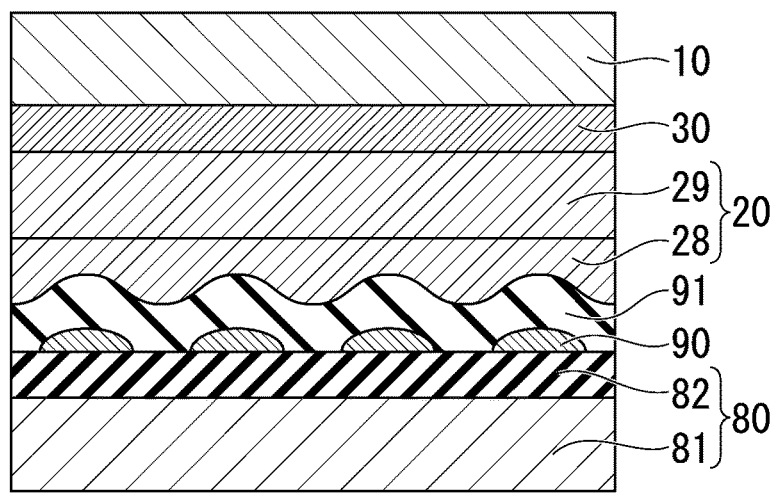
FIG. 9G is an explanatory diagram of one example of the method for manufacturing the magnetic domain wall movement type magnetic recording element according to the second embodiment.

Next, as shown in FIG. 9F, the magnetic body 29 is laminated on the first surface 28A of the magnetic body 28. The magnetic body 28 and the magnetic body 29 are the same. The magnetic body 28 and the magnetic body 29 are combined to form the magnetic recording layer 20.

Next, as shown in FIG. 9E, the non-magnetic layer 30 and the first ferromagnetic layer 10 are sequentially laminated on one surface of the magnetic recording layer 20. Then, the unnecessary portions of the non-magnetic layer 30 and the first ferromagnetic layer 10 are removed by photolithography or the like. With such a procedure, the magnetic domain wall movement type magnetic recording element 101 according to the second embodiment can be manufactured.

In the magnetic domain wall movement type magnetic recording element 101 according to the embodiment, the trap-reinforcing member 90 is covered with the insulating layer 91. The insulating layer 91 electrically separates the magnetic recording layer 20 from the base body 80. Therefore, the degree of freedom in selecting the trap-reinforcing member 90 is increased. Thus, the controllability of the movement of the magnetic domain wall 21 can be further enhanced as compared with the magnetic domain wall movement type magnetic recording element 100 of the first embodiment.

Although an example of the second embodiment has been described in detail, the second embodiment is not limited to this example, and various modifications and changes may be made within the scope of the present invention described in the appended claims. For example, the second embodiment can employ the same modified example as the first embodiment.

Figure 10:
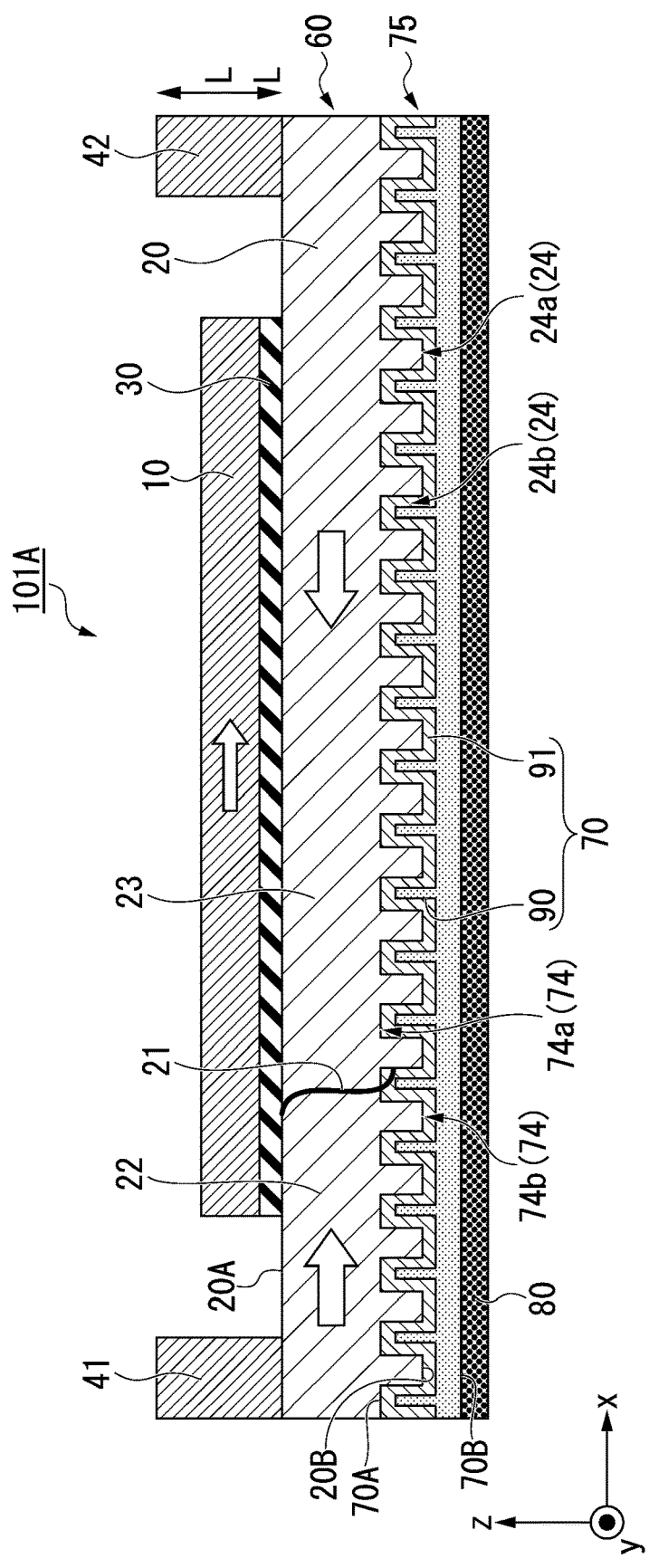
FIG. 10 is a cross-sectional view schematically showing a modified example of the magnetic domain wall movement type magnetic recording element according to the second embodiment.

FIG. 10 is a cross-sectional view schematically showing Modified Example 2 of the magnetic domain wall movement type magnetic recording element according to the second embodiment. A magnetic domain wall movement type magnetic recording element 101A according to Modified Example 2 is different from the magnetic domain wall movement type magnetic recording element 100 shown in FIG. 1 in that the adjacent trap-reinforcing members 90 are combined with each other and a layer is formed. The trap-reinforcing member 90 is a layer having concavity and convexity. The insulating layer 91 reflects the surface shape of the trap-reinforcing member 90. Therefore, the first surface 70A of the intermediate body 70 has the concave-convex structure 74. Also in this case, the second surface 20B of the magnetic recording layer 20 has the concave-convex structure 24, and the same effect as in the magnetic domain wall movement type magnetic recording element 101 can be obtained.

The magnetic domain wall movement type magnetic recording element 101A according to Modified Example 2 is manufactured by continuing the film formation until islands are combined with each other when the trap-reinforcing member 90 is laminated.

Third Embodiment

Figure 11:
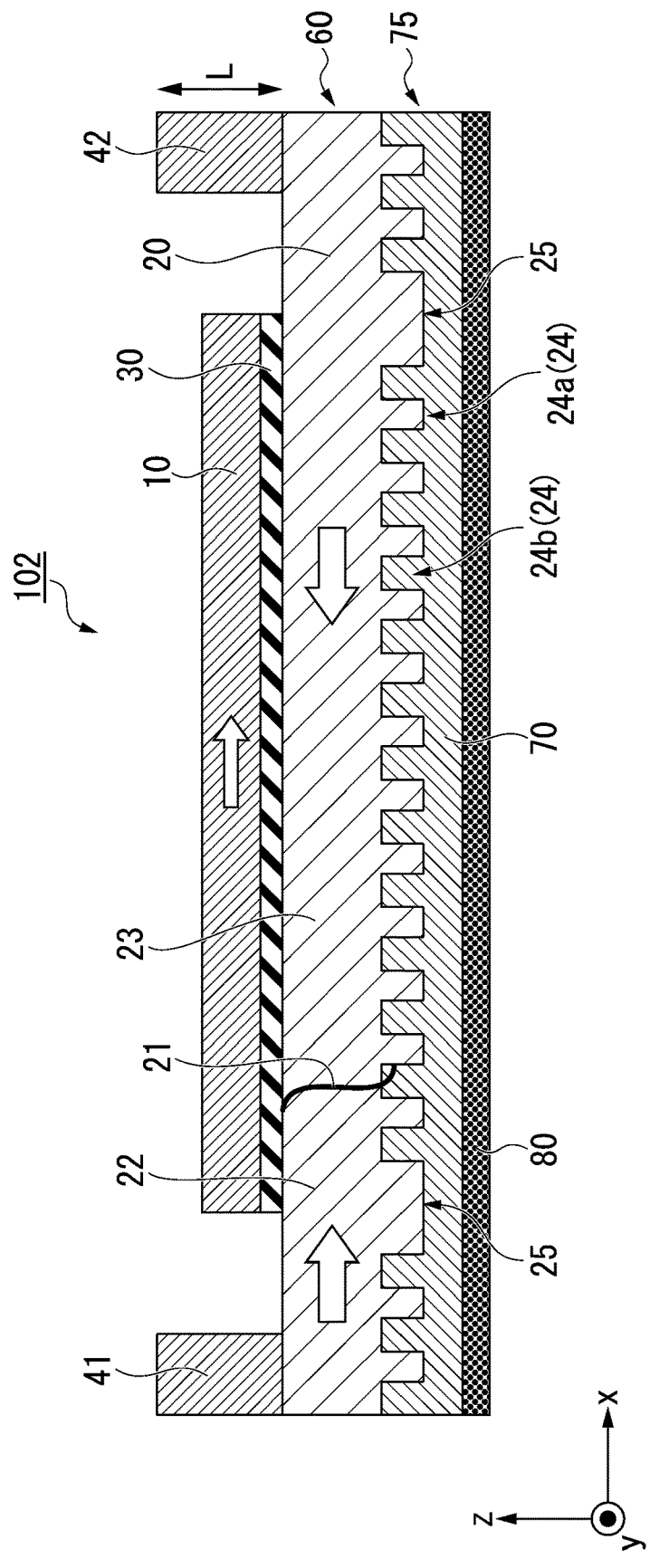
FIG. 11 is a cross-sectional view schematically showing a magnetic domain wall movement type magnetic recording element according to a third embodiment.
Figure 12:
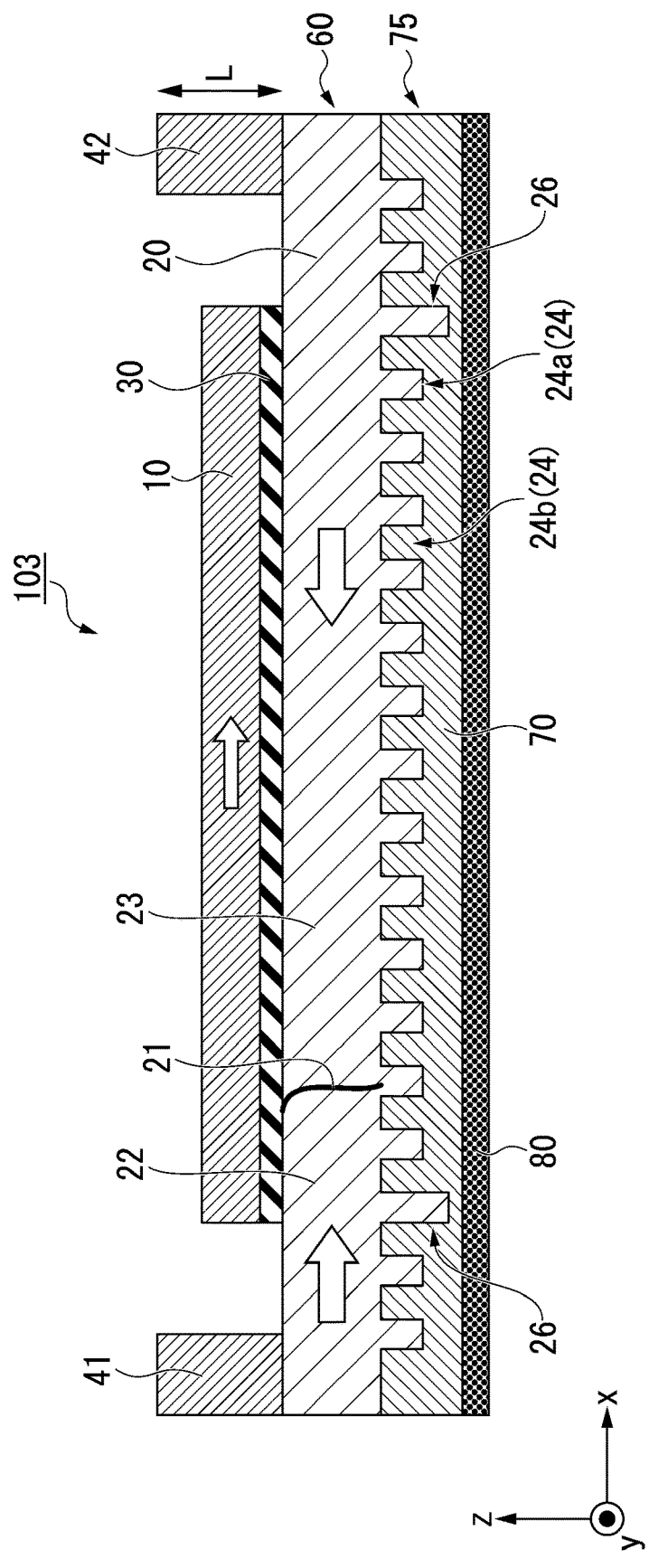
FIG. 12 is a cross-sectional view schematically showing the magnetic domain wall movement type magnetic recording element according to the third embodiment.

FIGS. 11 and 12 are schematic cross-sectional views of magnetic domain wall movement type magnetic recording elements according to a third embodiment. The magnetic domain wall movement type magnetic recording elements 102 and 103 shown in FIGS. 11 and 12 are different from the magnetic domain wall movement type magnetic recording element 101 shown in FIG. 1 in that, in the concave-convex structure 24 of the magnetic recording layer, some of the concave portions or the convex portions (the convex portions or the concave portions having a second shape) have different shapes from other concave portions or convex portions (the convex portions or the concave portions having a first shape). When the first shape is a convex portion, the second shape is a convex portion, and when the first shape is a concave portion, the second shape is a concave portion. The same parts as those of the magnetic domain wall movement type magnetic recording element according to the first embodiment are designated by the same reference numerals, and description thereof will be omitted. Hereinafter, a case in which the first shape is the convex portion 25 and the second shape is the convex portion 24a will be described as an example.

In the magnetic domain wall movement type magnetic recording element 102 shown in FIG. 11, the convex portion 25 having the second shape (hereinafter, referred to as a first convex portion 25) in the concave-convex structure 24 of the magnetic recording layer 20 is larger than the convex portion 24a having the first shape in the xz cross section in the extending direction (the x direction, a first direction) of the magnetic recording layer. Therefore, since the first convex portion 25 has a larger volume than the other convex portions 24a, the intensity of a generated magnetic field is large, and the movement of the magnetic domain wall 21 can be more strongly restricted than by the other convex portion 24a. In plan view from the z direction, at least a part of the first convex portion 25 is located inward from the first ferromagnetic layer 10 and overlaps an end surface of the first ferromagnetic layer 10. When the end surface of the first ferromagnetic layer 10 is inclined, the end surface may overlap any part of the end surface. In plan view, when the entire first convex portion 25 is located inward from the first ferromagnetic layer 10 and overlaps the end surface of the first ferromagnetic layer 10, the movement range of the magnetic domain wall 21 is controlled to be within a range which overlaps the first ferromagnetic layer 10. The resistance value of the magnetic domain wall movement type magnetic recording element 102 changes due to the difference in the magnetization state between the first ferromagnetic layer 10 and the magnetic recording layer 20. Even when the magnetic domain wall 21 moves to a position at which it does not overlap the first ferromagnetic layer 10, a change in the resistance value does not occur. That is, it is possible to suppress the magnetic domain wall 21 from reaching a portion that does not affect the change in the resistance value by controlling the movement range of the magnetic domain wall 21. Further, the range of the change in the resistance value of the magnetic domain wall movement type magnetic recording element 102 can be specified by defining the movement range of the magnetic domain wall 21.

In the magnetic domain wall movement type magnetic recording element 103 shown in FIG. 12, a convex portion 26 having the second shape (hereinafter, referred to as a second convex portion 26) in the concave-convex structure 24 of the magnetic recording layer 20 is larger than the convex portion 24a having the first shape in the xz cross section in the thickness direction (the z direction) of the magnetic recording layer. Therefore, since the second convex portion 26 has a larger volume than the other convex portion 24a, the intensity of a generated magnetic field is large, and the movement of the magnetic domain wall 21 can be more strongly restricted than by the other convex portion 24a. In plan view from the z direction, at least a part of the second convex portion 26 is located inward from the first ferromagnetic layer 10 and overlaps an end surface of the first ferromagnetic layer 10. Thus, the movement range of the magnetic domain wall 21 can be controlled, and it is possible to suppress the magnetic domain wall 21 from reaching a portion that does not affect the change in the resistance value. Further, the range of the change in the resistance value of the magnetic domain wall movement type magnetic recording element 103 can be specified by defining the movement range of the magnetic domain wall 21.

Here, although the volumes of the convex portions 25 and 26 having the second shape and the convex portion 24a having the first shape are compared, the comparison may be made based on areas of the convex portions 25 and 26 having the second shape and the convex portion 24a having the first shape in the xz cross section. The difference in the intensity of the magnetic field in the x direction controls the movement of the magnetic domain wall 21 in the x direction. Therefore, even when the volume is constant, the movement range of the magnetic domain wall 21 can be restricted when there is a difference between the convex portions 25 and 26 having the second shape and the convex portion 24a having the first shape in the xz cross section.

In the magnetic domain wall movement type magnetic recording elements 102 and 103 according to the third embodiment, the trapping function can be locally strengthened at positions of the convex portions larger than other convex portions, such as the first convex portion 25 and the second convex portion 26, and thus the movement speed of the magnetic domain wall 21 in the vicinity thereof can be largely changed. Therefore, when electric resistance and the like are continuously measured while the magnetic domain wall 21 is moved, a change point occurs in measurement data, and a position of the magnetic domain wall 21 below the first ferromagnetic layer 10 can be detected from this change point.

The change in the resistance value of the magnetic domain wall movement magnetic recording elements 102 and 103 occurs when the magnetic domain wall 21 is present at a position at which it overlaps the first ferromagnetic layer 10 in plan view. The concave portion or the convex portion of the second shape having a strong trapping function is preferably located at a position at which it overlaps the first ferromagnetic layer 10 in plan view in the lamination direction L of the recording part 60. Further, the concave or convex portion having the second shape is preferably disposed inward from an end portion of the first ferromagnetic layer 10 in the x direction and more preferably overlaps the end portion of the first ferromagnetic layer 10. When there is the concave or convex portion of the second shape having the strong trapping function at a position at which it overlaps both ends of the first ferromagnetic layer 10 in the x direction, an upper limit and a lower limit of the change in the resistance value are easily determined. That is, a start point and an end point of the multi-valued recording can be clarified, and reliability of data of the magnetic domain wall movement type magnetic recording elements 102 and 103 can be improved.

Although changing of the shape of the convex portion in the cross sections of the magnetic domain wall movement type magnetic recording elements 102 and 103 has been described, for example, the shape of the convex portion may be changed in plan view shape in the lamination direction L. Further, as a method other than changing the shape, for example, even when the trap-reinforcing member 90 shown in the second embodiment is provided only in some of the concave portions, the same effect as when the shape of the convex portion is changed can be obtained. Furthermore, even when the trap-reinforcing members 90 are provided in all the concave portions and only the trap-reinforcing members 90 provided in some of the concave portions are made of a material having a relatively strong trapping function, the same effect can be obtained.

Fourth Embodiment

Figure 13:
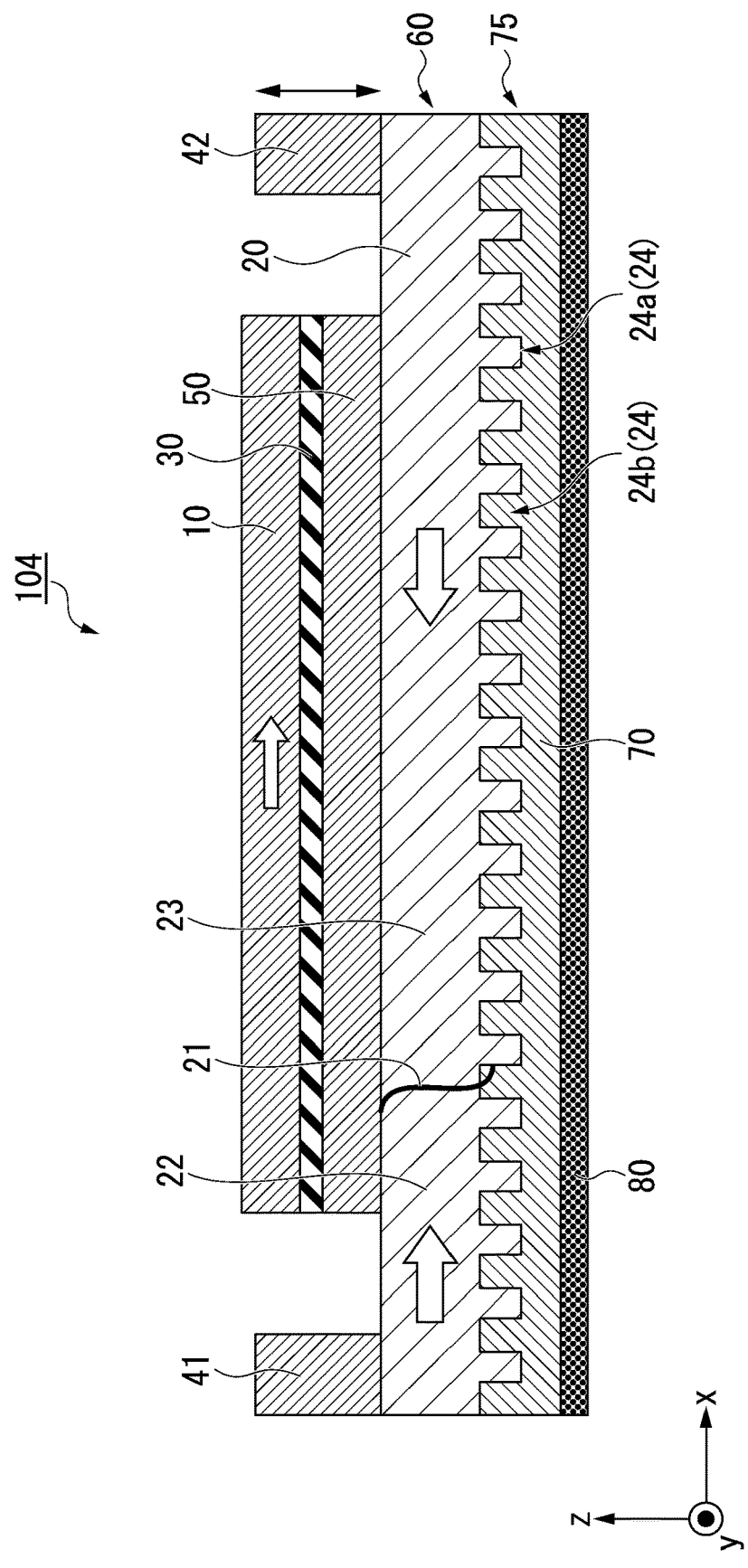
FIG. 13 is a cross-sectional view schematically showing a magnetic domain wall movement type magnetic recording element according to a fourth embodiment.

FIG. 13 is a schematic cross-sectional view of a magnetic domain wall movement type magnetic recording element according to a fourth embodiment. The magnetic domain wall movement type magnetic recording element 104 shown in FIG. 13 is different from the magnetic domain wall movement type magnetic recording element 100 shown in FIG. 1 in that a second ferromagnetic layer 50 which reflects the magnetization state of the magnetic recording layer 20 is provided between the magnetic recording layer 20 and the non-magnetic layer 30. The same parts as those of the magnetic domain wall movement type magnetic recording element 100 according to the first embodiment are designated by the same reference numerals, and description thereof will be omitted. The constitution of the magnetic domain wall movement type magnetic recording element according to the fourth embodiment can be applied to any of the elements according to the first to third embodiments.

The second ferromagnetic layer 50 includes a magnetic body. The same magnetic body as that of the first ferromagnetic layer 10 can be used for a magnetic body constituting the second ferromagnetic layer 50.

The second ferromagnetic layer 50 is adjacent to the magnetic recording layer 20. The magnetization of the second ferromagnetic layer 50 is magnetically coupled to the magnetization of the magnetic recording layer 20. Therefore, the second ferromagnetic layer 50 reflects a magnetic state of the magnetic recording layer 20. When the second ferromagnetic layer 50 and the magnetic recording layer 20 are ferromagnetically coupled, the magnetic state of the second ferromagnetic layer 50 becomes the same as the magnetization state of the magnetic recording layer 20, and when the second ferromagnetic layer 50 and the magnetic recording layer 20 are antiferromagnetically coupled, the magnetic state of the second ferromagnetic layer 50 is opposite to the magnetization state of the magnetic recording layer 20.

When the second ferromagnetic layer 50 is inserted between the magnetic recording layer 20 and the non-magnetic layer 30, functions of the second ferromagnetic layer 50 and the magnetic recording layer 20 in the magnetic domain wall movement type magnetic recording element 104 can be separated. The MR ratio of the magnetic domain wall movement type magnetic recording element 104 is caused by a change in the magnetization state of two magnetic bodies (the first ferromagnetic layer 10 and the second ferromagnetic layer 50) which sandwich the non-magnetic layer 30. Therefore, the second ferromagnetic layer 50 can mainly have a function of improving the MR ratio, and the magnetic recording layer 20 can mainly have a function of moving the magnetic domain wall 21.

When the functions of the second ferromagnetic layer 50 and the magnetic recording layer 20 are separated, the degree of freedom of the magnetic body constituting each increases. The second ferromagnetic layer 50 can be made of a material which provides a coherent tunnel effect with the first ferromagnetic layer 10, and the magnetic recording layer 20 can be made of a material which reduces the movement speed of the magnetic domain wall.

As described above, also in the magnetic domain wall movement type magnetic recording element 104 according to the fourth embodiment, the same effect as that in the first embodiment can be obtained. Further, the degree of freedom in selecting materials used for the layers can be increased by inserting the second ferromagnetic layer 50. In addition, the MR ratio of the magnetic domain wall movement type magnetic recording element 104 can be further increased by increasing the degree of freedom in selecting materials.

Fifth Embodiment

Figure 14:
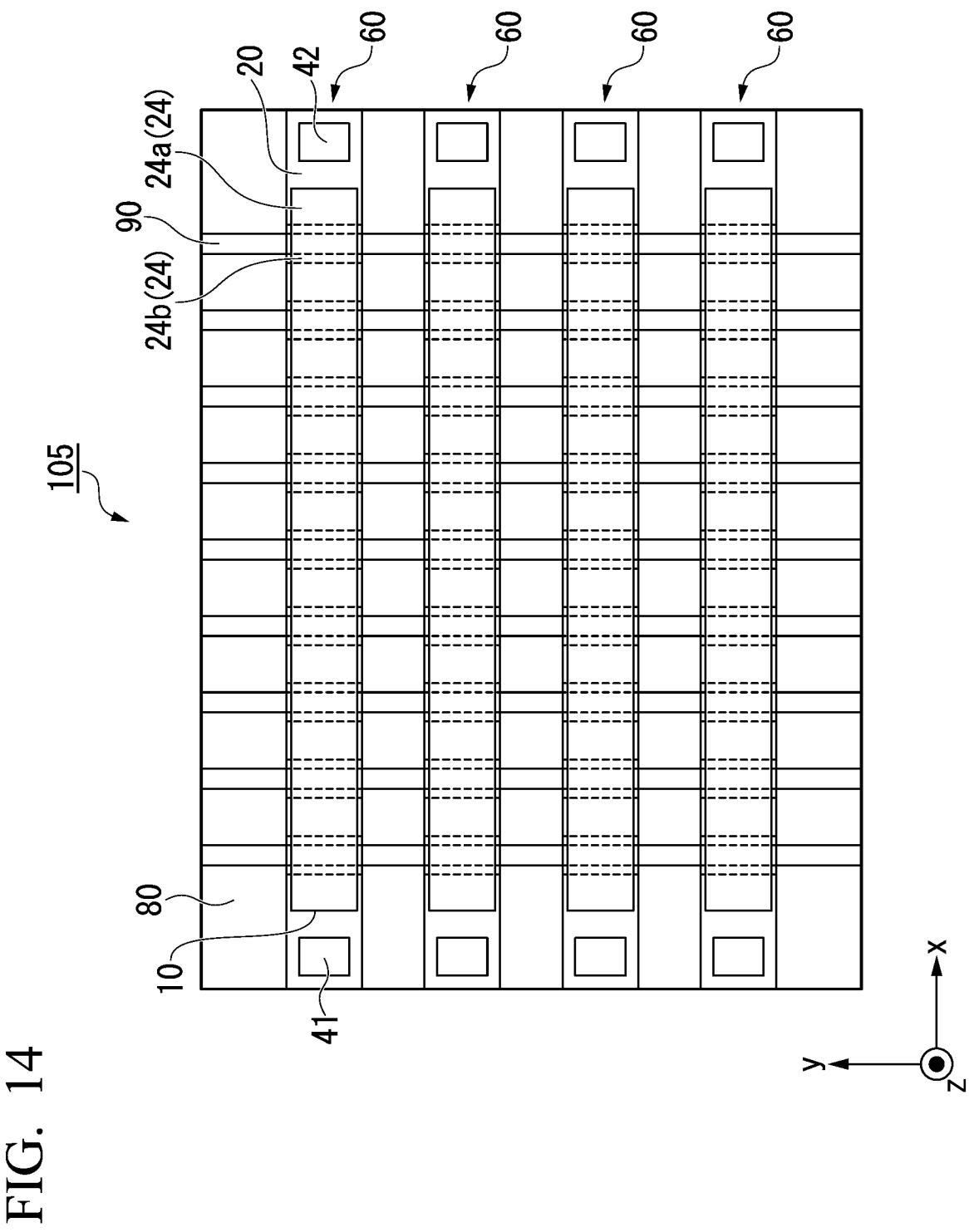
FIG. 14 is a plan view schematically showing a magnetic domain wall movement type magnetic recording element according to a fifth embodiment.

FIG. 14 is a schematic plan view of a magnetic domain wall movement type magnetic recording element 105 according to a fifth embodiment in which "a configuration having a plurality of recording parts 60" is added to the second embodiment. The magnetic domain wall movement type magnetic recording element 105 shown in FIG. 14 is different from the magnetic domain wall movement type magnetic recording element 101 shown in FIG. 8 in that a plurality of recording parts 60 are provided. The same parts as those of the magnetic domain wall movement type magnetic recording element 101 according to the second embodiment are designated by the same reference numerals, and description thereof will be omitted. The configuration of the magnetic domain wall movement type magnetic recording element 105 according to the fifth embodiment can be applied to any of the elements of the other embodiments.

The magnetic domain wall movement type magnetic recording element 105 shown in FIG. 14 has a plurality of recording parts 60 which extend substantially parallel to each other in the x direction (the first direction). The plurality of recording parts 60 are arranged at predetermined intervals in a second direction (the y direction in FIG. 14) which intersects the x direction. The plurality of recording parts 60 are formed on the control unit 75 which spreads in the xy plane. Further, the trap-reinforcing member 90 extends over the plurality of recording parts 60. For example, the trap-reinforcing member 90 extends to be in communication with the inside of the concave portion 24b constituting each of the recording parts and to cross the magnetic recording layer 20 in a direction intersecting the x direction.

The respective recording parts 60 are preferably disposed so that the concave-convex structures 24 (the positions of the convex portions 24a and the concave portions 24b) of the respective magnetic recording layers 20 overlap each other in plan view in the y direction. The trap-reinforcing member 90 can be formed linearly in the y direction. Further, in this case, a distance between the trap sites of the adjacent magnetic recording layers (between the convex portions 24a) can be made uniform, and an amount of movement of the magnetic domain wall with respect to a pulse input can be made uniform. That is, it becomes easy to simultaneously control the movement of the magnetic domain wall 21 in each of the plurality of recording parts 60.

Since the trap-reinforcing member 90 is present over the plurality of recording parts 60, the multi-valued recording can be performed in each of the recording parts 60 in the same manner That is, a multi-valued signal generated for each of the recording parts 60 can be changed evenly. The difference in signal strength between the recording parts 60 is reduced by making a threshold for recording data in each of the recording parts 60 constant. As a result, noise of the magnetic domain wall movement type magnetic recording element 105 as a whole is reduced, and multi-valued recording of data can be stably performed.

As described above, although the magnetic domain wall movement type magnetic recording element according to the embodiment has been described in detail with reference to the drawings, each of the constitutions and the combination thereof in each of the embodiments is an example, and addition, omission, substitution, and other changes of the constitution are possible without departing from the gist of the present invention.

Figure 15:
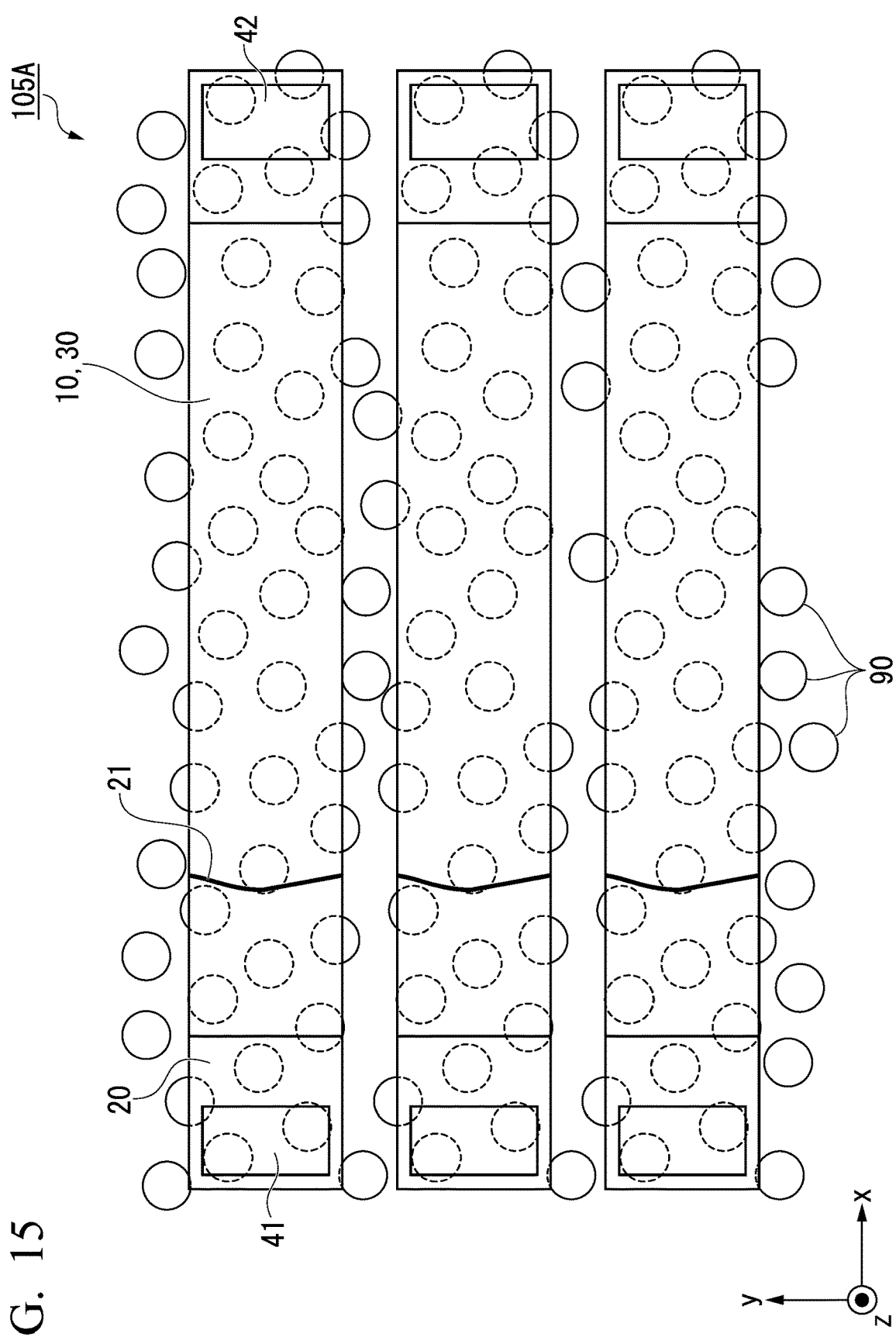
FIG. 15 is a plan view schematically showing a modified example of the magnetic domain wall movement type magnetic recording element according to the fifth embodiment.

FIG. 15 is a cross-sectional view schematically showing Modified Example 3 of the magnetic domain wall movement type magnetic recording element according to the fifth embodiment. A magnetic domain wall movement type magnetic recording element 105A according to Modified Example 3 is different from the magnetic domain wall movement type magnetic recording element 105 in that the trap-reinforcing members 90 are not linear but are scattered in the xy plane.

The trap-reinforcing member 90 is scattered irregularly in the xy plane. The plurality of recording parts 60 are formed on the trap-reinforcing member 90 which spreads in the xy plane. The trap-reinforcing member 90 spreads over the plurality of recording parts 60 in the xy plane.

The movement of the magnetic domain wall 21 in each of the recording parts 60 is controlled by the trap-reinforcing member 90 which spreads in the xy plane. When the trap-reinforcing member 90 is scattered irregularly, the movement of the magnetic domain wall 21 becomes irregular. Further, the magnetic domain wall 21 is inclined in the y direction. Since a data change in each of the recording parts 60 becomes irregular, the magnetic domain wall movement type magnetic recording element 105A is excellent in analog recording of data. Further, when the trap-reinforcing member 90 forms a layer, the "trap-reinforcing member 90" can be replaced with the "convex portion of the trap-reinforcing member 90".

Sixth Embodiment

Figure 16:
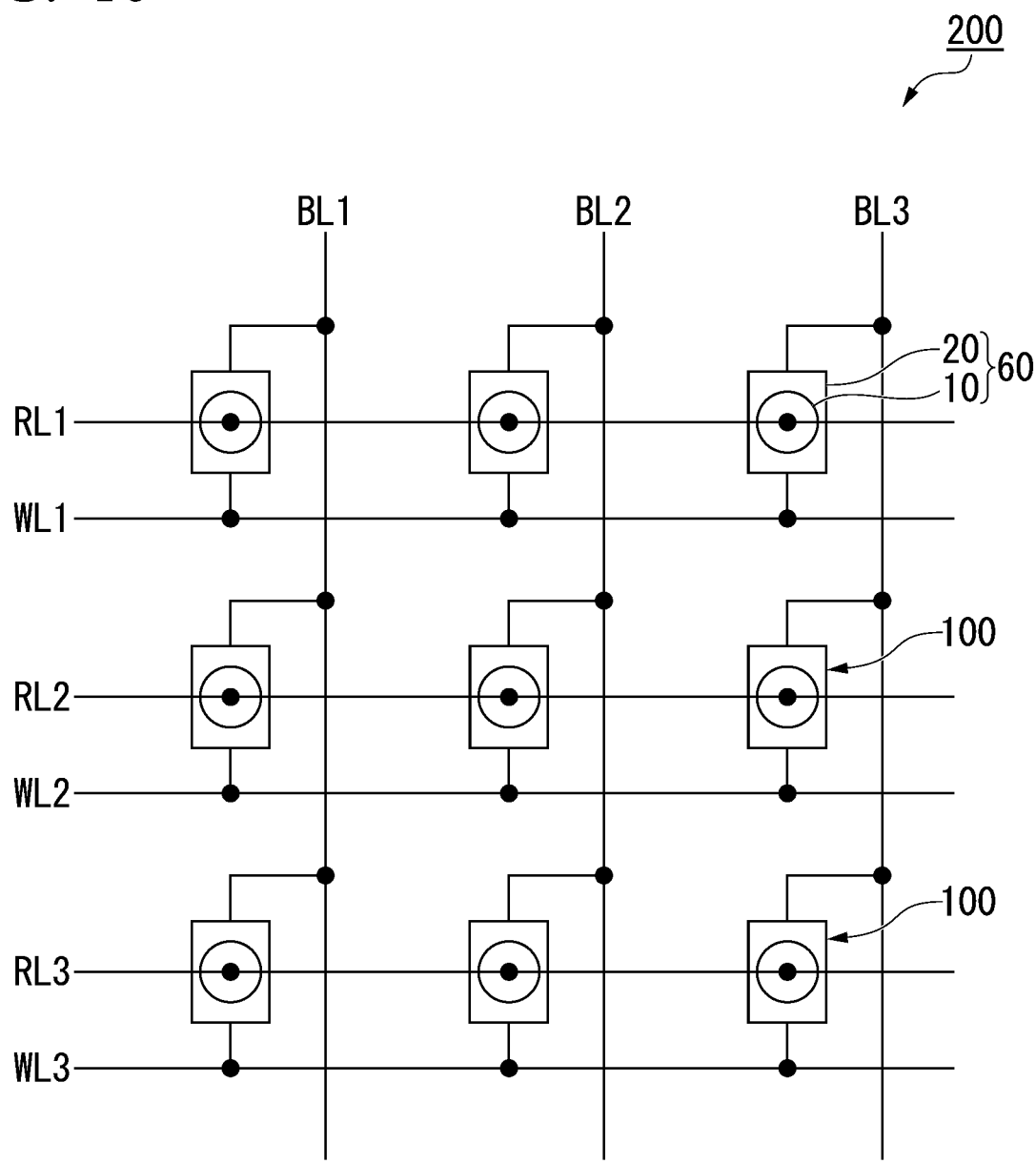
FIG. 16 is a schematic diagram of a magnetic recording array according to a sixth embodiment.

FIG. 16 is a plan view of a magnetic recording array 200 according to a sixth embodiment. In the magnetic recording array 200 shown in FIG. 16, the recording parts 60 of the magnetic domain wall movement type magnetic recording element have a 3×3 matrix arrangement. FIG. 16 is an example of a magnetic recording array, and the type, number, and arrangement of the recording parts 60 are arbitrary. Further, the control part may be provided to be present over all the recording parts 60, or may be provided for each of the recording parts 60.

The magnetic domain wall movement type magnetic recording element 100 is connected to one word line WL1 to WL3, one bit line BL1 to 3, and one read line RL1 to RL3.

A pulse current is applied to the magnetic recording layer 20 of an arbitrary recording part 60 by selecting the word lines WL1 to WL3 and the bit lines BL1 to BL3 to which a current is applied, and a write operation is performed. In addition, a current flows in the lamination direction of the arbitrary recording part 60 by selecting the read lines RL1 to RL3 and the bit lines BL1 to BL3 to which a current is applied, and a reading operation is performed. The word lines WL1 to WL3, the bit lines BL1 to BL3, and the read lines RL1 to RL3 to which a current is applied can be selected by a transistor or the like. Since each of the recording parts 60 records information in multiple values, a high-capacity magnetic recording array can be realized.

Although the embodiments have been described in detail, the present invention is not limited to a specific embodiment, and various modifications and changes may be made within the scope of the present invention described in the appended claims.

REFERENCE SIGNS LIST

10 First ferromagnetic layer
20 Magnetic recording layer
20A, 70A, 28A First surface
20B, 70B Second surface
21 Magnetic domain wall
22 First magnetic domain
23 Second magnetic domain
24, 74 Concave-convex structure
24a, 74a Convex portion
24b, 74b Concave portion
25 First convex portion
26 Second convex portion
28, 29 Magnetic body
30 Non-magnetic layer
41 First electrode
42 Second electrode
50 Second ferromagnetic layer
60 Recording part
70 Intermediate body (planarization layer)
75 Control part
80 Base body
81 Substrate
82 Underlayer
90 Trap-reinforcing member
91 Insulating layer
100 to 105, 100A, 101A, 105A Magnetic domain wall movement type magnetic recording element
200 Magnetic recording array

The invention claimed is:

1. A magnetic domain wall movement type magnetic recording element, comprising:
a first ferromagnetic layer which includes a ferromagnetic body;
a non-magnetic layer which faces the first ferromagnetic layer;

a magnetic recording layer which faces a surface of the non-magnetic layer on a side opposite to the first ferromagnetic layer and extends in a first direction; and a concave-convex structure of the magnetic recording layer, the concave-convex structure being on a second surface opposite to a first surface which faces the non-magnetic layer, wherein the first surface has a smaller arithmetic average roughness than an arithmetic average roughness of the second surface.

2. The magnetic domain wall movement type magnetic recording element according to claim 1, wherein, in the concave-convex structure, vertex positions of convex portions constituting the concave-convex structure are irregularly spaced in plan view in a lamination direction.

3. The magnetic domain wall movement type magnetic recording element according to claim 1, further comprising:
   a base body which faces the second surface of the magnetic recording layer; and
   an intermediate body which is located between the base body and the magnetic recording layer.

4. The magnetic domain wall movement type magnetic recording element according to claim 3, wherein:
   the intermediate body is a non-magnetic trap-reinforcing member, and
   the trap-reinforcing member is layers which are scattered on one surface of the base body or a layer which has concavity and convexity on the second surface side of the magnetic recording layer.

5. The magnetic domain wall movement type magnetic recording element according to claim 3, wherein:
   the intermediate body has a trap-reinforcing member, and an insulating layer which covers the trap-reinforcing member from a position near the base body, and
   the trap-reinforcing member is layers which are scattered on one surface of the base body or a layer which has concavity and convexity on the second surface side of the magnetic recording layer.

6. The magnetic domain wall movement type magnetic recording element according to claim 4, wherein:
   one end of the trap-reinforcing member is in contact with the base body, and
   when a surface energy of a material constituting a surface of the base body is $\gamma_A$, and a surface energy of a material of the trap-reinforcing member is $\gamma_B$, $\gamma_B < \gamma_A$, and a surface energy mismatch $\Gamma_{AB}$ defined by the following Equation (1) is larger than 0.5

[Math 1]

$$\Gamma_{AB} = 2\left|\frac{\gamma_A - \gamma_B}{\gamma_A + \gamma_B}\right|. \quad (1)$$

7. The magnetic domain wall movement type magnetic recording element according to claim 4, wherein:
   a plurality of recording parts which includes the first ferromagnetic layer, the nonmagnetic layer and the magnetic recording layer are provided,
   the plurality of recording parts are arranged in a second direction which intersects the first direction, and
   the trap-reinforcing member spreads in a same plane over the plurality of recording parts.

8. The magnetic domain wall movement type magnetic recording element according to claim 4, wherein:
   a plurality of recording parts which includes the first ferromagnetic layer, the nonmagnetic layer and the magnetic recording layer are provided, and
   the trap-reinforcing member or a convex portion of the trap-reinforcing member extends in a second direction which intersects the first direction over the plurality of recording parts.

9. The magnetic domain wall movement type magnetic recording element according to claim 1, wherein the concave-convex structure has periodicity in the first direction.

10. The magnetic domain wall movement type magnetic recording element according to claim 1, wherein the concave-convex structure has a concave portion or a convex portion having a first shape, and a concave portion or a convex portion having a second shape having a larger volume than that of the first shape.

11. The magnetic domain wall movement type magnetic recording element according to claim 10, wherein the concave portion or the convex portion having the second shape is located at a position at which the concave portion or the convex portion having the second shape overlaps an end surface of the first ferromagnetic layer in plan view in the lamination direction.

12. The magnetic domain wall movement type magnetic recording element according to claim 10, wherein the concave or convex portion having the second shape is larger than the concave or convex portion having the first shape in the first direction.

13. The magnetic domain wall movement type magnetic recording element according to claim 10, wherein the concave or convex portion having the second shape is larger than the concave or convex portion having the first shape in the lamination direction.

14. The magnetic domain wall movement type magnetic recording element according to claim 1, wherein a second ferromagnetic layer which reflects a magnetization state of the magnetic recording layer is provided between the magnetic recording layer and the non-magnetic layer.

15. A magnetic domain wall movement type magnetic recording element comprising:
   a recording part which includes:
      a first ferromagnetic layer which includes a ferromagnetic body;
      a magnetic recording layer which is laminated on one side of the first ferromagnetic layer, extends in a first direction which intersects a lamination direction, has a magnetic domain wall, and has a concave-convex structure which traps the magnetic domain wall on a side opposite to the first ferromagnetic layer; and
      a non-magnetic layer sandwiched between the first ferromagnetic layer and the magnetic recording layer; and
   a control part which has a planarization layer laminated on a side of the magnetic recording layer opposite to the first ferromagnetic layer and planarizes the concave-convex structure of the magnetic recording layer.

16. The magnetic domain wall movement type magnetic recording element according to claim 1, wherein, in the concave-convex structure, vertex positions of convex portions constituting the concave-convex structure are irregularly spaced in plan view in a lamination direction.

17. The magnetic domain wall movement type magnetic recording element according to claim 1, further comprising:
   a base body which faces the second surface of the magnetic recording layer; and an intermediate body which is located between the base body and the magnetic recording layer.

18. The magnetic domain wall movement type magnetic recording element according to claim 2, further comprising:
- a base body which faces the second surface of the magnetic recording layer; and
- an intermediate body which is located between the base body and the magnetic recording layer.

19. The magnetic domain wall movement type magnetic recording element according to claim 5, wherein:
- one end of the trap-reinforcing member is in contact with the base body, and
- when a surface energy of a material constituting a surface of the base body is $\gamma_A$, and a surface energy of a material of the trap-reinforcing member is $\gamma_B$, $\gamma_B < \gamma_A$, and a surface energy mismatch $\Gamma_{AB}$ defined by the following Equation (1) is larger than 0.5

[Math 1]

$$\Gamma_{AB} = 2\left|\frac{\gamma_A - \gamma_B}{\gamma_A + \gamma_B}\right|. \quad (1)$$

20. The magnetic domain wall movement type magnetic recording element according to claim 1, wherein:
- the magnetic domain wall is formed inside the magnetic recording layer, and
- the concave-convex structure is disposed within a movement range of the magnetic domain wall.

* * * * *